(12) United States Patent
Alsaleem

(10) Patent No.: US 10,344,997 B2
(45) Date of Patent: Jul. 9, 2019

(54) HEAT PUMP AND AIR CONDITIONING GRADING SYSTEMS AND METHODS

(71) Applicant: Emerson Climate Technologies, Inc., Sidney, OH (US)

(72) Inventor: Fadi Mohammad Alsaleem, Troy, OH (US)

(73) Assignee: Emerson Climate Technologies, Inc., Sidney, OH (US)

( * ) Notice: Subject to any disclaimer, the term of this patent is extended or adjusted under 35 U.S.C. 154(b) by 788 days.

(21) Appl. No.: 14/705,340

(22) Filed: May 6, 2015

(65) Prior Publication Data

US 2015/0323423 A1   Nov. 12, 2015

Related U.S. Application Data

(60) Provisional application No. 61/989,758, filed on May 7, 2014.

(51) Int. Cl.
*G01K 17/08* (2006.01)
*F24F 3/044* (2006.01)
(Continued)

(52) U.S. Cl.
CPC .............. *F24F 11/30* (2018.01); *F24F 3/044* (2013.01); *G01K 13/00* (2013.01); *G01K 17/08* (2013.01);
(Continued)

(58) Field of Classification Search
CPC .. F24F 11/001; F24F 11/0012; F24F 11/0086; F24F 3/044; F24F 2011/0046;
(Continued)

(56) References Cited

U.S. PATENT DOCUMENTS

| | | |
|---|---|---|
| 4,574,871 A | 3/1986 | Parkinson et al. |
| 4,660,759 A | 4/1987 | Barnard et al. |

(Continued)

FOREIGN PATENT DOCUMENTS

| | | |
|---|---|---|
| CN | 1752624 A | 3/2006 |
| CN | 1910528 A | 2/2007 |

(Continued)

OTHER PUBLICATIONS

Wikipedia: SEER <https://web.archive.org/web/20130906172844/https://en.wikipedia.org/wiki/Seasonal_energy_efficiency_ratio> retrieved by Archive.org on Sep. 6, 2013.*

(Continued)

*Primary Examiner* — Alexander Satanovsky
*Assistant Examiner* — Mark I Crohn
(74) *Attorney, Agent, or Firm* — Harness, Dickey & Pierce, P.L.C.

(57) ABSTRACT

An expectation module determines an expected average power consumption of a heat pump for a predetermined period as a function of indoor and outdoor temperatures of the building during the predetermined period. A difference module determines a power difference between an average power consumption of the heat pump during the predetermined period and the expected average power consumption of the heat pump for the predetermined period. A grade determination module determines a grade of the heat pump for the predetermined period based on the power difference of the predetermined period. A reporting module generates a displayable report including the grade of the heat pump for the predetermined period.

24 Claims, 21 Drawing Sheets

(51) Int. Cl.

| | | |
|---|---|---|
| *F24F 11/30* | (2018.01) | |
| *G01M 99/00* | (2011.01) | |
| *G01K 13/00* | (2006.01) | |
| *G01R 21/00* | (2006.01) | |
| *F24F 140/50* | (2018.01) | |
| *F24F 11/52* | (2018.01) | |
| *F24F 130/10* | (2018.01) | |
| *F24F 110/10* | (2018.01) | |
| *F24F 11/32* | (2018.01) | |
| *F24F 110/00* | (2018.01) | |
| *F24F 140/60* | (2018.01) | |
| *F24F 130/00* | (2018.01) | |

(52) U.S. Cl.
CPC ......... *G01M 99/005* (2013.01); *G01R 21/00* (2013.01); *F24F 11/32* (2018.01); *F24F 11/52* (2018.01); *F24F 2110/00* (2018.01); *F24F 2110/10* (2018.01); *F24F 2130/00* (2018.01); *F24F 2130/10* (2018.01); *F24F 2140/50* (2018.01); *F24F 2140/60* (2018.01)

(58) Field of Classification Search
CPC ....... F24F 2011/0047; F24F 2011/0052; F24F 2011/0058; F24F 2011/0091; G01K 13/00; G01K 17/08; G01M 99/005; G01R 21/00
See application file for complete search history.

(56) References Cited

U.S. PATENT DOCUMENTS

| | | | |
|---|---|---|---|
| 6,259,959 | B1 | 7/2001 | Martin |
| 6,385,510 | B1 | 5/2002 | Hoog et al. |
| 7,377,450 | B2 | 5/2008 | Van Ostrand et al. |
| 8,800,309 | B2 | 8/2014 | Buda et al. |
| 9,285,802 | B2 | 3/2016 | Arensmeier |
| 2004/0159113 | A1 | 8/2004 | Singh et al. |
| 2005/0125102 | A1 | 6/2005 | Nichols et al. |
| 2006/0036349 | A1 | 2/2006 | Kates |
| 2007/0109301 | A1 | 5/2007 | Smith |
| 2009/0015400 | A1 | 1/2009 | Breed |
| 2010/0326470 | A1* | 12/2010 | Seippel ............... B08B 3/02 134/14 |
| 2011/0144807 | A1 | 6/2011 | Buda et al. |
| 2012/0022702 | A1 | 1/2012 | Jang |
| 2012/0072029 | A1 | 3/2012 | Persaud et al. |
| 2012/0221150 | A1* | 8/2012 | Arensmeier ....... G05B 23/0224 700/276 |
| 2012/0330626 | A1 | 12/2012 | An et al. |
| 2013/0096723 | A1 | 4/2013 | Ludwig |
| 2013/0176130 | A1 | 7/2013 | Hoesl |
| 2013/0179373 | A1* | 7/2013 | Mutchnik .......... G06Q 30/0283 705/412 |
| 2013/0261809 | A1 | 10/2013 | Morrow et al. |
| 2014/0005837 | A1 | 1/2014 | Fadell et al. |
| 2014/0012422 | A1 | 1/2014 | Kates |
| 2014/0074730 | A1 | 3/2014 | Arensmeier et al. |
| 2015/0127174 | A1 | 5/2015 | Quam et al. |

FOREIGN PATENT DOCUMENTS

| | | |
|---|---|---|
| CN | 1910572 A | 2/2007 |
| CN | 101616022 A | 12/2009 |
| CN | 101939597 A | 1/2011 |
| CN | 102713475 A | 10/2012 |
| CN | 103403463 A | 11/2013 |
| CN | 103597292 A | 2/2014 |
| EP | 1950505 A2 | 7/2008 |
| EP | 2239388 A1 | 10/2010 |
| JP | 2008045810 A | 2/2008 |
| JP | 2008101865 A | 5/2008 |
| JP | 2008267768 A | 11/2008 |
| JP | 5597669 B2 | 10/2014 |
| KR | 101151867 B1 | 5/2012 |
| WO | WO-2013130799 A1 | 9/2013 |
| WO | WO-2013149210 A1 | 10/2013 |
| WO | WO-2014033189 A1 | 3/2014 |

OTHER PUBLICATIONS

Wikipedia: Grading <https://web.archive.org/web/20140320154817/https://en.wikipedia.org/wiki/Grading_(education)> retrieved by Archive.org on Mar. 20, 2014.*
International Search Report regarding International Patent Application No. PCT/US2015/029509, dated Aug. 19, 2015.
Written Opinion of the International Searching Authority regarding International Patent Application No. PCT/US2015/029509, dated Aug. 19, 2015.
Office Action regarding U.S. Appl. No. 14/705,289, dated Jul. 15, 2016.
Interview Summary regarding U.S. Appl. No. 14/705,263, dated Aug. 17, 2016.
Interview Summary regarding U.S. Appl. No. 14/705,289, dated Oct. 14, 2016.
Office Action regarding U.S. Appl. No. 14/705,289, dated Nov. 3, 2016.
Examiner's Answer regarding U.S. Appl. No. 14/705,289, dated Jul. 28, 2017.
Extended European Search Report for 15789424.7, dated Dec. 18, 2017.
Interview Summary regarding U.S. Appl. No. 14/705,263, dated Jul. 1, 2016.
Office Action regarding U.S. Appl. No. 14/705,263, dated Jul. 7, 2016.
International Search Report regarding International Application No. PCT/US2015/029500, dated Aug. 31, 2015.
Written Opinion of the International Searching Authority regarding International Application No. PCT/US2015/029500, dated Aug. 31, 2015.
International Search Report regarding International Application No. PCT/US2015/029489, dated Jul. 23, 2015.
International Search Report regarding International Application No. PCT/US2015/029507, dated Jul. 27, 2015.
Written Opinion of the International Searching Authority regarding International Application No. PCT/US2015/029489, dated Jul. 23, 2015.
Written Opinion of the International Searching Authority regarding International Application No. PCT/US2015/029507, dated Jul. 27, 2015.
Office Action regarding U.S. Appl. No. 14/705,263, dated Apr. 18, 2016.
Wikipedia: R-Value <https://web.archive.org/web/20140218100015/https://en.wikipedia.org/wiki/R-value_(insulation)> retrieved by Archive.org on Feb. 18, 2014.
Wikipedia: Least Squares <https://web.archive.org/web/20140417021259/https://en.wikipedia.org/wiki/Least_squares> retrieved by Archive.org on Apr. 17, 2014.
Office Action and Search Report from Chinese Patent Office regarding Chinese Application No. 201580023901.5 dated Jul. 26, 2018.
Office Action and Search Report from Chinese Patent Office regarding Chinese Application No. 201580036090.2 dated May 28, 2018.
Office Action and Search Report from Chinese Patent Office regarding Chinese Application No. 201580036086.6 dated Sep. 4, 2018.

* cited by examiner

US 10,344,997 B2

HEAT PUMP AND AIR CONDITIONING GRADING SYSTEMS AND METHODS

CROSS-REFERENCE TO RELATED APPLICATIONS

This application claims the benefit of U.S. Provisional Application No. 61/989,758, filed on May 7, 2014. The entire disclosure of the application referenced above is incorporated herein by reference.

FIELD

The present disclosure relates to environmental comfort systems and more particularly to remote monitoring and diagnosis of residential and light commercial environmental comfort systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A residential or light commercial HVAC (heating, ventilation, or air conditioning) system controls environmental parameters, such as temperature and humidity, of a building. The target values for the environmental parameters, such as a temperature set point, may be specified by a user or owner of the building, such as an employee working in the building or a homeowner.

In FIG. 1, a block diagram of an example HVAC system is presented. In this particular example, a forced air system with a gas furnace is shown. Return air is pulled from the building through a filter 104 by a circulator blower 108. The circulator blower 108, also referred to as a fan, is controlled by a control module 112. The control module 112 receives signals from a thermostat 116. For example only, the thermostat 116 may include one or more temperature set points specified by the user.

The thermostat 116 may direct that the circulator blower 108 be turned on at all times or only when a heat request or cool request is present (automatic fan mode). In various implementations, the circulator blower 108 can operate at multiple speeds or at any speed within a predetermined range. One or more switching relays (not shown) may be used to control the circulator blower 108 and/or to select a speed of the circulator blower 108.

The thermostat 116 provides the heat and/or cool requests to the control module 112. When a heat request is made, the control module 112 causes a burner 120 to ignite. Heat from combustion is introduced to the return air provided by the circulator blower 108 in a heat exchanger 124. The heated air is supplied to the building and is referred to as supply air.

The burner 120 may include a pilot light, which is a small constant flame for igniting the primary flame in the burner 120. Alternatively, an intermittent pilot may be used in which a small flame is first lit prior to igniting the primary flame in the burner 120. A sparker may be used for an intermittent pilot implementation or for direct burner ignition. Another ignition option includes a hot surface igniter, which heats a surface to a high enough temperature that, when gas is introduced, the heated surface initiates combustion of the gas. Fuel for combustion, such as natural gas, may be provided by a gas valve 128.

The products of combustion are exhausted outside of the building, and an inducer blower 132 may be turned on prior to ignition of the burner 120. In a high efficiency furnace, the products of combustion may not be hot enough to have sufficient buoyancy to exhaust via conduction. Therefore, the inducer blower 132 creates a draft to exhaust the products of combustion. The inducer blower 132 may remain running while the burner 120 is operating. In addition, the inducer blower 132 may continue running for a set period of time after the burner 120 turns off.

A single enclosure, which will be referred to as an air handler unit 136, may include the filter 104, the circulator blower 108, the control module 112, the burner 120, the heat exchanger 124, the inducer blower 132, an expansion valve 140, an evaporator 144, and a condensate pan 146. In various implementations, the air handler unit 136 includes an electrical heating device (not shown) instead of or in addition to the burner 120. When used in addition to the burner 120, the electrical heating device may provide backup or secondary heat.

In FIG. 1, the HVAC system includes a split air conditioning system. Refrigerant is circulated through a compressor 148, a condenser 152, the expansion valve 140, and the evaporator 144. The evaporator 144 is placed in series with the supply air so that when cooling is desired, the evaporator 144 removes heat from the supply air, thereby cooling the supply air. During cooling, the evaporator 144 is cold, which causes water vapor to condense. This water vapor is collected in the condensate pan 146, which drains or is pumped out.

A control module 156 receives a cool request from the control module 112 and controls the compressor 148 accordingly. The control module 156 also controls a condenser fan 160, which increases heat exchange between the condenser 152 and outside air. In such a split system, the compressor 148, the condenser 152, the control module 156, and the condenser fan 160 are generally located outside of the building, often in a single condensing unit 164.

In various implementations, the control module 156 may simply include a run capacitor, a start capacitor, and a contactor or relay. In fact, in certain implementations, the start capacitor may be omitted, such as when a scroll compressor instead of a reciprocating compressor is being used. The compressor 148 may be a variable-capacity compressor and may respond to a multiple-level cool request. For example, the cool request may indicate a mid-capacity call for cool or a high-capacity call for cool.

The electrical lines provided to the condensing unit 164 may include a 240 volt mains power line (not shown) and a 24 volt switched control line. The 24 volt control line may correspond to the cool request shown in FIG. 1. The 24 volt control line controls operation of the contactor. When the control line indicates that the compressor should be on, the contactor contacts close, connecting the 240 volt power supply to the compressor 148. In addition, the contactor may connect the 240 volt power supply to the condenser fan 160. In various implementations, such as when the condensing unit 164 is located in the ground as part of a geothermal system, the condenser fan 160 may be omitted. When the 240 volt mains power supply arrives in two legs, as is common in the U.S., the contactor may have two sets of contacts, and can be referred to as a double-pole single-throw switch.

Monitoring of operation of components in the condensing unit 164 and the air handler unit 136 has traditionally been performed by an expensive array of multiple discrete sensors that measure current individually for each component. For example, a first sensor may sense the current drawn by a motor, another sensor measures resistance or current flow of an igniter, and yet another sensor monitors a state of a gas valve. However, the cost of these sensors and the time required for installation of, and taking readings from, the sensors has made monitoring cost-prohibitive.

SUMMARY

In a feature, a grading system is disclosed. An expectation module determines an expected average power consumption of a heat pump of a building for a predetermined period as a function of indoor and outdoor temperatures of the building during the predetermined period. A difference module determines a power difference between an average power consumption of the heat pump during the predetermined period and the expected power consumption of the heat pump for the predetermined period. A grade determination module determines a grade of the heat pump for the predetermined period based on the power difference of the predetermined period. A reporting module generates a displayable report including the grade of the heat pump for the predetermined period.

In a feature, the expectation module determines the expected average power consumption of the heat pump for the predetermined period using a mapping that relates indoor and outdoor temperatures to expected average power consumption of the heat pump.

In a feature, the expectation module determines the expected average power consumption of the heat pump for the predetermined period as a function of: (i) an average of a plurality of indoor air temperatures measured during the predetermined period; and (ii) an average of a plurality of outdoor air temperatures measured during the predetermined period.

In a feature, the grade determination module sets the grade of the heat pump for the predetermined period based on 100 minus an absolute value of the power difference of the predetermined period.

In a feature, an adjusting module determines an adjusted power difference for the predetermined period based on the power difference of the predetermined period, and the grade determination module determines the grade of the heat pump for the predetermined period based on the adjusted power difference of the predetermined period.

In a feature: when the average power consumption of the heat pump during the predetermined period is greater than the expected average power consumption of the heat pump for the predetermined period, the adjusting module determines the adjusted power difference based on a product of a first predetermined gain and the power difference of the predetermined period; and, when the average power consumption of the heat pump during the predetermined period is less than the expected average power consumption of the heat pump for the predetermined period, the adjusting module determines the adjusted power difference based on a product of a second predetermined gain and the power difference of the predetermined period.

In a feature, the first predetermined gain is one of greater than and less than the second predetermined gain.

In a feature, the grade determination module determines the grade of the heat pump for the predetermined period further based on a comparison of a temperature range for the predetermined period with a temperature difference between a return air temperature of the predetermined period and a supply air temperature of the predetermined period.

In a feature, a range module sets the temperature range for the predetermined period based on the outdoor temperature of the building during the predetermined period.

In a feature: the grade determination module decreases the grade of the heat pump for the predetermined period when the temperature difference is greater than an upper boundary of the temperature range; and the grade determination module decreases the grade of the heat pump for the predetermined period when the temperature difference is less than a lower boundary of the temperature range.

In a feature, a grading method is disclosed. The grading method includes: determining an expected average power consumption of a heat pump of a building for a predetermined period as a function of indoor and outdoor temperatures of the building during the predetermined period; determining a power difference between an average power consumption of the heat pump during the predetermined period and the expected average power consumption of the heat pump for the predetermined period; determining a grade of the heat pump for the predetermined period based on the power difference of the predetermined period; and generating a report for display on a display, the report including the grade of the heat pump for the predetermined period.

In a feature, the grading method further includes determining the expected average power consumption of the heat pump for the predetermined period using a mapping that relates indoor and outdoor temperatures to expected average power consumption of the heat pump.

In a feature, the grading method further includes determining the expected average power consumption of the heat pump for the predetermined period as a function of: (i) an average of a plurality of indoor air temperatures measured during the predetermined period; and (ii) an average of a plurality of outdoor air temperatures measured during the predetermined period.

In a feature, the grading method further includes setting the grade of the heat pump for the predetermined period based on 100 minus an absolute value of the power difference of the predetermined period.

In a feature, the grading method further includes: determining an adjusted power difference for the predetermined period based on the power difference of the predetermined period; and determining the grade of the heat pump for the predetermined period based on the adjusted power difference of the predetermined period.

In a feature, the grading method further includes: when the average power consumption of the heat pump during the predetermined period is greater than the expected average power consumption of the heat pump for the predetermined period, determining the adjusted power difference based on a product of a first predetermined gain and the power difference of the predetermined period; and, when the average power consumption of the heat pump during the predetermined period is less than the expected average power consumption of the heat pump for the predetermined period, determining the adjusted power difference based on a product of a second predetermined gain and the power difference of the predetermined period.

In a feature, the first predetermined gain is one of greater than and less than the second predetermined gain.

In a feature, the grading method further includes determining the grade of the heat pump for the predetermined period further based on a comparison of a temperature range for the predetermined period with a temperature difference between a return air temperature of the predetermined period and a supply air temperature of the predetermined period.

In a feature, the grading method further includes setting the temperature range for the predetermined period based on the outdoor temperature of the building during the predetermined period.

In a feature, the grading method further includes: decreasing the grade of the heat pump for the predetermined period when the temperature difference is greater than an upper boundary of the temperature range; and decreasing the grade of the heat pump for the predetermined period when the temperature difference is less than a lower boundary of the temperature range.

In a feature, a grading system is disclosed. A difference module determines a power difference between an actual average power consumption of a heat pump of a building during a predetermined period and an expected average power consumption of the heat pump for the predetermined period. A grade determination module determines a grade of the heat pump for the predetermined period based on the power difference, a split temperature of the heat pump during the predetermined period, a liquid temperature of the heat pump during the predetermined period, a return air temperature of the heat pump during the predetermined period, and a discharge temperature of the heat pump during the predetermined period. A reporting module generates a displayable report including the grade of the heat pump for the predetermined period.

In a feature: a capacity module determines a capacity score for the heat pump during the predetermined period based on the power difference, the split temperature of the heat pump during the predetermined period, the liquid temperature of the heat pump during the predetermined period, the return air temperature of the heat pump during the predetermined period, and the discharge temperature of the heat pump during the predetermined period; and an airflow module determines an airflow score for the heat pump during the predetermined period based on the power difference, the split temperature during the predetermined period, the liquid temperature during the predetermined period, the return air temperature during the predetermined period, and the discharge temperature during the predetermined period. The grading module determines the grade of the heat pump for the predetermined period as a function of the power difference, the capacity score, and the airflow score.

In a feature, a reference module determines at least one reference temperature for the heat pump during the predetermined period based on an outdoor ambient temperature during the predetermined period. The capacity module determines the capacity score further based on the at least one reference temperature for the heat pump during the predetermined period.

In a feature, the capacity module determines the capacity score for the heat pump during the predetermined period based on: a first difference between the liquid temperature and the return air temperature; and a second difference between the discharge temperature and the return air temperature.

In a feature: the reference module determines first, second, and third reference temperatures for the heat pump during the predetermined period based on the outdoor ambient temperature during the predetermined period, and the capacity module determines the capacity score for the heat pump during the predetermined period as a function of a third difference between (a) the split temperature and (b) the first reference temperature, a fourth difference between (a) the first difference and (b) the second reference temperature, and a fifth difference between (a) the second difference and (b) the third reference temperature.

In a feature: a reference module determines at least one reference temperature for the heat pump during the predetermined period based on an outdoor ambient temperature during the predetermined period, and the airflow module determines the airflow score further based on the at least one reference temperature for the heat pump during the predetermined period.

In a feature, the airflow module determines the airflow score for the heat pump during the predetermined period based on: a first difference between the liquid temperature and the return air temperature; and a second difference between the discharge temperature and the return air temperature.

In a feature: the reference module determines first, second, and third reference temperatures for the heat pump during the predetermined period based on the outdoor ambient temperature during the predetermined period; and the airflow module determines the airflow score for the heat pump during the predetermined period as a function of a third difference between (a) the split temperature and (b) the first reference temperature, a fourth difference between (a) the first difference and (b) the second reference temperature, and a fifth difference between (a) the second difference and (b) the third reference temperature.

In a feature, the grading module sets the grade of the heat pump for the predetermined period based on 100 minus the power difference minus the capacity score minus the airflow score.

In a feature, an expectation module determines the expected average power consumption of the heat pump of the building for the predetermined period as a function of an outdoor temperature of the building during the predetermined period.

In a feature, a grading method is disclosed. The grading method includes: determining a power difference between an actual average power consumption of a heat pump of a building during a predetermined period and an expected average power consumption of the heat pump for the predetermined period; determining a grade of the heat pump for the predetermined period based on the power difference, a split temperature of the heat pump during the predetermined period, a liquid temperature of the heat pump during the predetermined period, a return air temperature of the heat pump during the predetermined period, and a discharge temperature of the heat pump during the predetermined period; and generating a displayable report including the grade of the heat pump for the predetermined period.

In a feature, the grading method further includes: determining a capacity score for the heat pump during the predetermined period based on the power difference, the split temperature of the heat pump during the predetermined period, the liquid temperature of the heat pump during the predetermined period, the return air temperature of the heat pump during the predetermined period, and the discharge temperature of the heat pump during the predetermined period; and determining an airflow score for the heat pump during the predetermined period based on the power difference, the split temperature during the predetermined period, the liquid temperature during the predetermined period, the return air temperature during the predetermined period, and the discharge temperature during the predetermined period. Determining the grade of the heat pump for the predetermined period comprises determining the grade of the heat pump for the predetermined period as a function of the power difference, the capacity score, and the airflow score.

In a feature, the grading method further includes: determining at least one reference temperature for the heat pump during the predetermined period based on an outdoor ambient temperature during the predetermined period; and determining the capacity score further based on the at least one reference temperature for the heat pump during the predetermined period.

In a feature, determining the capacity score for the heat pump during the predetermined period comprises determining the capacity score for the heat pump during the predetermined period based on: a first difference between the liquid temperature and the return air temperature; and a second difference between the discharge temperature and the return air temperature.

In a feature: determining at least one reference temperature includes determining first, second, and third reference temperatures for the heat pump during the predetermined period based on the outdoor ambient temperature during the predetermined period; and determining the capacity score for the heat pump during the predetermined period comprises determining the capacity score for the heat pump during the predetermined period as a function of a third difference between (a) the split temperature and (b) the first reference temperature, a fourth difference between (a) the first difference and (b) the second reference temperature, and a fifth difference between (a) the second difference and (b) the third reference temperature.

In a feature, the grading method further includes: determining at least one reference temperature for the heat pump during the predetermined period based on an outdoor ambient temperature during the predetermined period; and determining the airflow score further based on the at least one reference temperature for the heat pump during the predetermined period.

In a feature, determining the airflow score for the heat pump during the predetermined period comprises determining the airflow score for the heat pump during the predetermined period based on: a first difference between the liquid temperature and the return air temperature; and a second difference between the discharge temperature and the return air temperature.

In a feature: determining at least one reference temperature comprises determining first, second, and third reference temperatures for the heat pump during the predetermined period based on the outdoor ambient temperature during the predetermined period; and determining the airflow score for the heat pump during the predetermined period comprises determining the airflow score for the heat pump during the predetermined period as a function of a third difference between (a) the split temperature and (b) the first reference temperature, a fourth difference between (a) the first difference and (b) the second reference temperature, and a fifth difference between (a) the second difference and (b) the third reference temperature.

In a feature, determining the grade of the heat pump comprises setting the grade of the heat pump for the predetermined period based on 100 minus the power difference minus the capacity score minus the airflow score.

In a feature, the grading method further includes determining the expected average power consumption of the heat pump of the building for the predetermined period as a function of an outdoor temperature of the building during the predetermined period.

In a feature, a grading system is disclosed. A difference module determines a power difference between an actual average power consumption of an air conditioning (A/C) system of a building during a predetermined period and an expected average power consumption of the A/C system for the predetermined period. A grade determination module determines a grade of the A/C system for the predetermined period based on the power difference, a period that the A/C system was ON during the predetermined period, a suction temperature of the A/C system during the predetermined period, and a split temperature of the A/C system during the predetermined period. A reporting module generates a displayable report including the grade of the A/C system for the predetermined period.

In a feature: a capacity module determines a capacity score for the A/C system during the predetermined period based on the period that the A/C system was ON during the predetermined period, the suction temperature of the A/C system during the predetermined period, the split temperature of the A/C system during the predetermined period, and the actual average power consumption of the A/C system during the predetermined period; and an airflow module determines an airflow score for the A/C system during the predetermined period based on the period that the A/C system was ON during the predetermined period, the suction temperature of the A/C system during the predetermined period, the split temperature of the A/C system during the predetermined period, and a power consumption of an indoor portion of the A/C system during the predetermined period. The grading module determines the grade of the A/C system for the predetermined period as a function of the power difference, the capacity score, and the airflow score.

In a feature, a two stage module determines a two stage score for the A/C system during the predetermined period as a function of an outdoor air temperature during the predetermined period, a period of operation of the A/C system in a single stage mode during the predetermined period, and a second period of operation of the A/C system in a two stage mode during the predetermined period. The grading module determines the grade of the A/C system for the predetermined period further based on the two stage score.

In a feature, the grading module sets the grade of the A/C system for the predetermined period based on 100 minus the power difference minus the capacity score minus the airflow score minus the two stage score.

In a feature, the capacity module: determines a first value as a function of the period that the A/C system was ON during the predetermined period; determines a second value as a function the suction temperature of the A/C system during the predetermined period; determines a third value as a function of the split temperature of the A/C system during the predetermined period; determines a fourth value as a function of the actual average power consumption of the A/C system during the predetermined period; and determines the capacity score based on the first, second, third, and fourth values.

In a feature, the capacity module sets the capacity score equal to a sum of the first, second, third, and fourth values.

In a feature, the airflow module: determines a first value as a function of the period that the A/C system was ON during the predetermined period; determines a second value as a function of the suction temperature of the A/C system during the predetermined period; determines a third value as a function of the split temperature of the A/C system during the predetermined period; determines a fourth value as a function of the power consumption of the indoor portion of the A/C system during the predetermined period; and determines the airflow score based on the first, second, third, and fourth values.

In a feature, the airflow module sets the airflow score equal to a sum of the first, second, third, and fourth values.

In a feature, the suction temperature of the A/C system during the predetermined period is an average of a plurality of suction temperatures of the A/C system during the predetermined period, and the split temperature of the A/C system during the predetermined period is an average of a plurality of split temperatures of the A/C system during the predetermined period.

In a feature, an expectation module determines the expected average power consumption of the A/C system of the building for the predetermined period as a function of an outdoor air temperature during the predetermined period, a tonnage rating of the A/C system, and a Seasonal Energy Efficiency Ratio (SEER) of the A/C system.

In a feature, a grading method is disclosed. The grading method includes: determining a power difference between an actual average power consumption of an air conditioning (A/C) system of a building during a predetermined period and an expected average power consumption of the A/C system for the predetermined period; determining a grade of the A/C system for the predetermined period based on the power difference, a period that the A/C system was ON during the predetermined period, a suction temperature of the A/C system during the predetermined period, and a split temperature of the A/C system during the predetermined period; and generating a displayable report including the grade of the A/C system for the predetermined period.

In a feature, the grading method further includes: determining a capacity score for the A/C system during the predetermined period based on the period that the A/C system was ON during the predetermined period, the suction temperature of the A/C system during the predetermined period, the split temperature of the A/C system during the predetermined period, and the actual average power consumption of the A/C system during the predetermined period; and determining an airflow score for the A/C system during the predetermined period based on the period that the A/C system was ON during the predetermined period, the suction temperature of the A/C system during the predetermined period, the split temperature of the A/C system during the predetermined period, and a power consumption of an indoor portion of the A/C system during the predetermined period. Determining the grade of the A/C system for the predetermined period comprises determining the grade of the A/C system for the predetermined period as a function of the power difference, the capacity score, and the airflow score.

In a feature, the grading method further includes: determining a two stage score for the A/C system during the predetermined period as a function of an outdoor air temperature during the predetermined period, a period of operation of the A/C system in a single stage mode during the predetermined period, and a second period of operation of the A/C system in a two stage mode during the predetermined period; and determining the grade of the A/C system for the predetermined period further based on the two stage score.

In a feature, determining the grade of the A/C system for the predetermined period comprises setting the grade of the A/C system for the predetermined period based on 100 minus the power difference minus the capacity score minus the airflow score minus the two stage score.

In a feature, the grading method further includes: determining a first value as a function of the period that the A/C system was ON during the predetermined period; determining a second value as a function the suction temperature of the A/C system during the predetermined period; determining a third value as a function of the split temperature of the A/C system during the predetermined period; and determining a fourth value as a function of the actual average power consumption of the A/C system during the predetermined period. Determining the capacity score comprises determining the capacity score based on the first, second, third, and fourth values.

In a feature, determining the capacity score comprises setting the capacity score equal to a sum of the first, second, third, and fourth values.

In a feature, the grading method further includes: determining a first value as a function of the period that the A/C system was ON during the predetermined period; determining a second value as a function of the suction temperature of the A/C system during the predetermined period; determining a third value as a function of the split temperature of the A/C system during the predetermined period; and determining a fourth value as a function of the power consumption of the indoor portion of the A/C system during the predetermined period. Determining the airflow score comprises determining the airflow score based on the first, second, third, and fourth values.

In a feature, determining the airflow score comprises setting the airflow score equal to a sum of the first, second, third, and fourth values.

In a feature, the suction temperature of the A/C system during the predetermined period is an average of a plurality of suction temperatures of the A/C system during the predetermined period, and the split temperature of the A/C system during the predetermined period is an average of a plurality of split temperatures of the A/C system during the predetermined period.

In a feature, the grading method further includes determining the expected average power consumption of the A/C system of the building for the predetermined period as a function of an outdoor air temperature during the predetermined period, a tonnage rating of the A/C system, and a Seasonal Energy Efficiency Ratio (SEER) of the A/C system.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

According to the present disclosure, a monitoring system can be integrated with a residential or light commercial HVAC (heating, ventilation, or air conditioning) system of a building. The monitoring system can provide information on the status, maintenance, and efficiency of the HVAC system to customers and/or contractors associated with the building. For example, the building may be a single-family residence, and the customer may be the homeowner, a landlord, or a tenant. In other implementations, the building may be a light commercial building, and the customer may be the building owner, a tenant, or a property management company.

As used in this application, the term HVAC can encompass all environmental comfort systems in a building, including heating, cooling, humidifying, dehumidifying, and air exchanging and purifying, and covers devices such as furnaces, heat pumps, humidifiers, dehumidifiers, and air conditioners. HVAC systems as described in this application do not necessarily include both heating and air conditioning, and may instead have only one or the other.

In split HVAC systems with an air handler unit (often, located indoors) and a condensing unit (often, located outdoors), an air handler monitor module and a condensing monitor module, respectively, can be used. The air handler monitor module and the condensing monitor module may be integrated by the manufacturer of the HVAC system, may be added at the time of the installation of the HVAC system, and/or may be retrofitted to an existing HVAC system.

Figure 1:
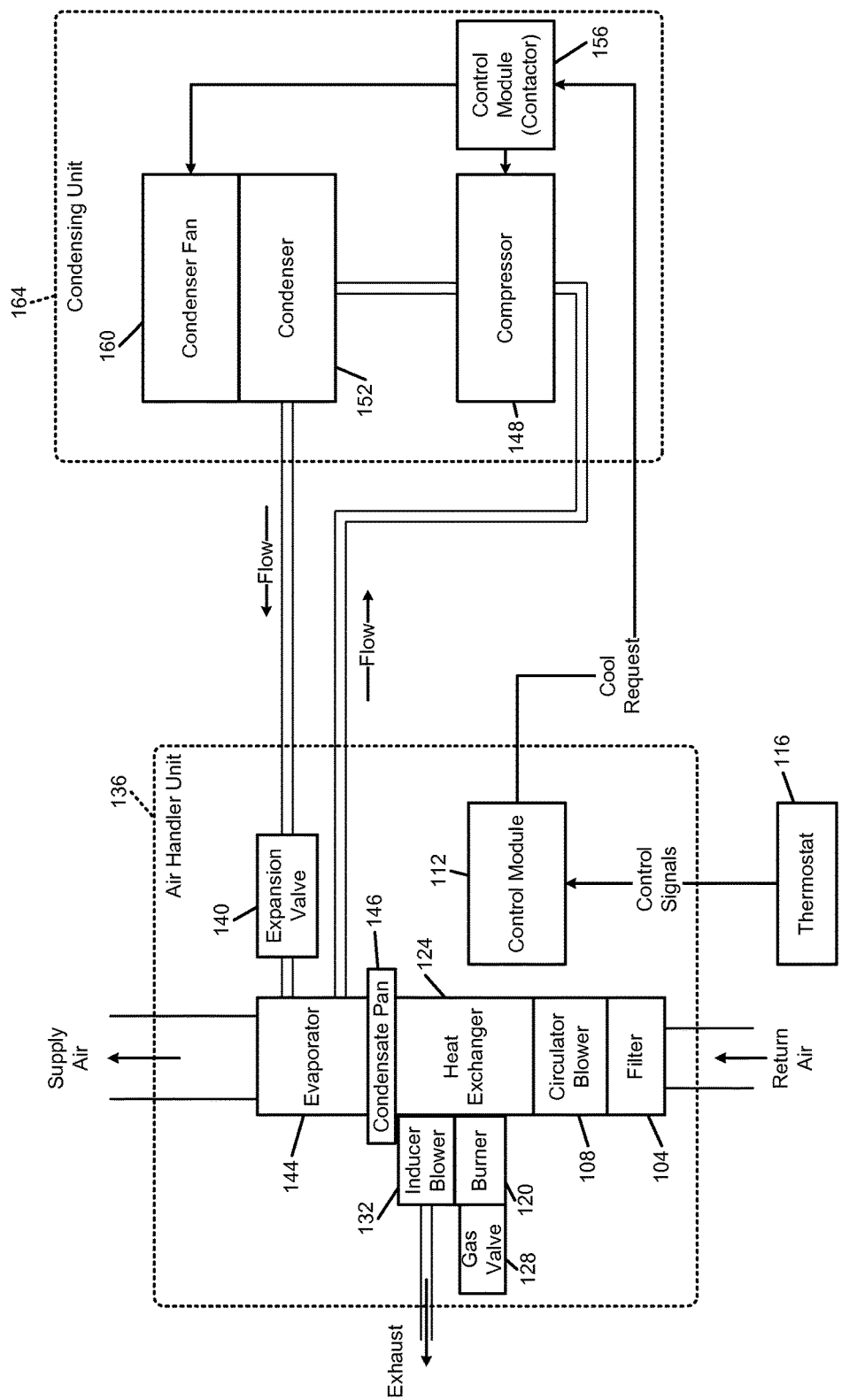
FIG. 1 is a block diagram of an example HVAC system according to the prior art.

In heat pump systems, the function of the air handler unit and the condensing unit are reversed depending on the mode of the heat pump. As a result, although the present disclosure uses the terms air handler unit and condensing unit, the terms indoor unit and outdoor unit could be used instead in the context of a heat pump. The terms indoor unit and outdoor unit emphasize that the physical locations of the components stay the same while their roles change depending on the mode of the heat pump. A reversing valve selectively reverses the flow of refrigerant from what is shown in FIG. 1 depending on whether the system is heating the building or cooling the building. When the flow of refrigerant is reversed, the roles of the evaporator and condenser are reversed—i.e., refrigerant evaporation occurs in what is labeled the condenser while refrigerant condensation occurs in what is labeled as the evaporator.

The air handler monitor and condensing monitor modules monitor operating parameters of associated components of the HVAC system. For example, the operating parameters may include power supply current, power supply voltage, operating and ambient temperatures of inside and outside air, refrigerant temperatures at various points in the refrigerant loop, fault signals, control signals, and humidity of inside and outside air.

The principles of the present disclosure may be applied to monitoring other systems, such as a hot water heater, a boiler heating system, a refrigerator, a refrigeration case, a pool heater, a pool pump/filter, etc. As an example, the hot water heater may include an igniter, a gas valve (which may be operated by a solenoid), an igniter, an inducer blower, and a pump. The monitoring system may analyze aggregate current readings to assess operation of the individual components of the hot water heater.

The air handler monitor and condensing monitor modules may communicate data between each other, while one or both of the air handler monitor and condensing monitor modules upload data to a remote location. The remote location may be accessible via any suitable network, including the Internet.

The remote location includes one or more computers, which will be referred to as servers. The servers execute a monitoring system on behalf of a monitoring company. The monitoring system receives and processes the data from the air handler monitor and condensing monitor modules of customers who have such systems installed. The monitoring system can provide performance information, diagnostic alerts, and error messages to a customer and/or third parties, such as designated HVAC contractors.

A server of the monitoring system includes a processor and memory. The memory stores application code that processes data received from the air handler monitor and condensing monitor modules and determines existing and/or impending failures, as described in more detail below. The processor executes this application code and stores received data either in the memory or in other forms of storage, including magnetic storage, optical storage, flash memory storage, etc. While the term server is used in this application, the application is not limited to a single server.

A collection of servers may together operate to receive and process data from the air handler monitor and condensing monitor modules of multiple buildings. A load balancing algorithm may be used between the servers to distribute processing and storage. The present application is not limited to servers that are owned, maintained, and housed by a monitoring company. Although the present disclosure describes diagnostics and processing and alerting occurring in a remote monitoring system, some or all of these functions may be performed locally using installed equipment and/or customer resources, such as on a customer computer or computers.

Customers and/or HVAC contractors may be notified of current and predicted issues affecting effectiveness or efficiency of the HVAC system, and may receive notifications related to routine maintenance. The methods of notification may take the form of push or pull updates to an application, which may be executed on a smart phone or other mobile device or on a standard computer. Notifications may also be viewed using web applications or on local displays, such as on a thermostat or other displays located throughout the building or on a display (not shown) implemented in the air handler monitor module or the condensing monitor module. Notifications may also include text messages, emails, social networking messages, voicemails, phone calls, etc.

The air handler monitor and condensing monitor modules may each sense an aggregate current for the respective unit without measuring individual currents of individual components. The aggregate current data may be processed using frequency domain analysis, statistical analysis, and state machine analysis to determine operation of individual components based on the aggregate current data. This processing may happen partially or entirely in a server environment, remote from the customer's building or residence.

The frequency domain analysis may allow individual contributions of HVAC system components to be determined. Some of the advantages of using an aggregate current measurement may include reducing the number of current sensors that would otherwise be necessary to monitor each of the HVAC system components. This reduces bill of materials costs, as well as installation costs and potential installation problems. Further, providing a single time-domain current stream may reduce the amount of bandwidth necessary to upload the current data. Nevertheless, the present disclosure could also be used with additional current sensors.

Based on measurements from the air handler monitor and condensing monitor modules, the monitoring company can determine whether HVAC components are operating at their peak performance and can advise the customer and the contractor when performance is reduced. This performance reduction may be measured for the system as a whole, such as in terms of efficiency, and/or may be monitored for one or more individual components.

In addition, the monitoring system may detect and/or predict failures of one or more components of the system. When a failure is detected, the customer can be notified and potential remediation steps can be taken immediately. For example, components of the HVAC system may be shut down to prevent or minimize damage, such as water damage, to HVAC components. The contractor can also be notified that a service call will be required. Depending on the contractual relationship between the customer and the contractor, the contractor may immediately schedule a service call to the building.

The monitoring system may provide specific information to the contractor, including identifying information of the customer's HVAC system, including make and model numbers, as well as indications of the specific part numbers that appear to be failing. Based on this information, the contractor can allocate the correct repair personnel that have experience with the specific HVAC system and/or component. In addition, the service technician is able to bring replacement parts, avoiding return trips after diagnosis.

Depending on the severity of the failure, the customer and/or contractor may be advised of relevant factors in determining whether to repair the HVAC system or replace some or all of the components of the HVAC system. For example only, these factors may include relative costs of repair versus replacement, and may include quantitative or qualitative information about advantages of replacement equipment. For example, expected increases in efficiency and/or comfort with new equipment may be provided. Based on historical usage data and/or electricity or other commodity prices, the comparison may also estimate annual savings resulting from the efficiency improvement.

As mentioned above, the monitoring system may also predict impending failures. This allows for preventative maintenance and repair prior to an actual failure. Alerts regarding detected or impending failures reduce the time when the HVAC system is out of operation and allows for more flexible scheduling for both the customer and contractor. If the customer is out of town, these alerts may prevent damage from occurring when the customer is not present to detect the failure of the HVAC system. For example, failure of heat in winter may lead to pipes freezing and bursting.

Alerts regarding potential or impending failures may specify statistical timeframes before the failure is expected. For example only, if a sensor is intermittently providing bad data, the monitoring system may specify an expected amount of time before it is likely that the sensor effectively stops working due to the prevalence of bad data. Further, the monitoring system may explain, in quantitative or qualitative terms, how the current operation and/or the potential failure will affect operation of the HVAC system. This enables the customer to prioritize and budget for repairs.

For the monitoring service, the monitoring company may charge a periodic rate, such as a monthly rate. This charge may be billed directly to the customer and/or may be billed to the contractor. The contractor may pass along these charges to the customer and/or may make other arrangements, such as by requiring an up-front payment upon installation and/or applying surcharges to repairs and service visits.

For the air handler monitor and condensing monitor modules, the monitoring company or contractor may charge the customer the equipment cost, including the installation cost, at the time of installation and/or may recoup these costs as part of the monthly fee. Alternatively, rental fees may be charged for the air handler monitor and condensing monitor modules, and once the monitoring service is stopped, the air handler monitor and condensing monitor modules may be returned.

The monitoring service may allow the customer and/or contractor to remotely monitor and/or control HVAC components, such as setting temperature, enabling or disabling heating and/or cooling, etc. In addition, the customer may be able to track energy usage, cycling times of the HVAC system, and/or historical data. Efficiency and/or operating costs of the customer's HVAC system may be compared against HVAC systems of neighbors, whose buildings will be subject to the same or similar environmental conditions. This allows for direct comparison of HVAC system and overall building efficiency because environmental variables, such as temperature and wind, are controlled.

The installer can provide information to the remote monitoring system including identification of control lines that were connected to the air handler monitor module and condensing monitor module. In addition, information such as the HVAC system type, year installed, manufacturer, model number, BTU rating, filter type, filter size, tonnage, etc.

In addition, because the condensing unit may have been installed separately from the furnace, the installer may also record and provide to the remote monitoring system the manufacturer and model number of the condensing unit, the year installed, the refrigerant type, the tonnage, etc. Upon installation, baseline tests are run. For example, this may include running a heating cycle and a cooling cycle, which the remote monitoring system records and uses to identify initial efficiency metrics. Further, baseline profiles for current, power, and frequency domain current can be established.

The server may store baseline data for the HVAC system of each building. The baselines can be used to detect changes indicating impending or existing failures. For example only, frequency-domain current signatures of failures of various components may be pre-programmed, and may be updated based on observed evidence from contractors. For example, once a malfunction in an HVAC system is recognized, the monitoring system may note the frequency data leading up to the malfunction and correlate that frequency signature with frequency signatures associated with potential causes of the malfunction. For example only, a computer learning system, such as a neural network or a genetic algorithm, may be used to refine frequency signatures. The frequency signatures may be unique to different types of HVAC systems but may share common characteristics. These common characteristics may be adapted based on the specific type of HVAC system being monitored.

The installer may collect a device fee, an installation fee, and/or a subscription fee from the customer. In various implementations, the subscription fee, the installation fee, and the device fee may be rolled into a single system fee, which the customer pays upon installation. The system fee may include the subscription fee for a set number of years, such as 1, 2, 5, or 10, or may be a lifetime subscription, which may last for the life of the home or the ownership of the building by the customer.

The monitoring system can be used by the contractor during and after installation and during and after repair (i) to verify operation of the air handler monitor and condensing monitor modules, as well as (ii) to verify correct installation of the components of the HVAC system. In addition, the customer may review this data in the monitoring system for assurance that the contractor correctly installed and configured the HVAC system. In addition to being uploaded to the remote monitoring service (also referred to as the cloud), monitored data may be transmitted to a local device in the building. For example, a smartphone, laptop, or proprietary portable device may receive monitoring information to diagnose problems and receive real-time performance data. Alternatively, data may be uploaded to the cloud and then downloaded onto a local computing device, such as via the Internet from an interactive web site.

The historical data collected by the monitoring system may allow the contractor to properly specify new HVAC components and to better tune configuration, including dampers and set points of the HVAC system. The information collected may be helpful in product development and assessing failure modes. The information may be relevant to warranty concerns, such as determining whether a particular problem is covered by a warranty. Further, the information may help to identify conditions, such as unauthorized system modifications, that could potentially void warranty coverage.

Original equipment manufacturers may subsidize partially or fully the cost of the monitoring system and air handler and condensing monitor modules in return for access to this information. Installation and service contractors may also subsidize some or all of these costs in return for access to this information, and for example, in exchange for being recommended by the monitoring system. Based on historical service data and customer feedback, the monitoring system may provide contractor recommendations to customers.

Figure 2A:
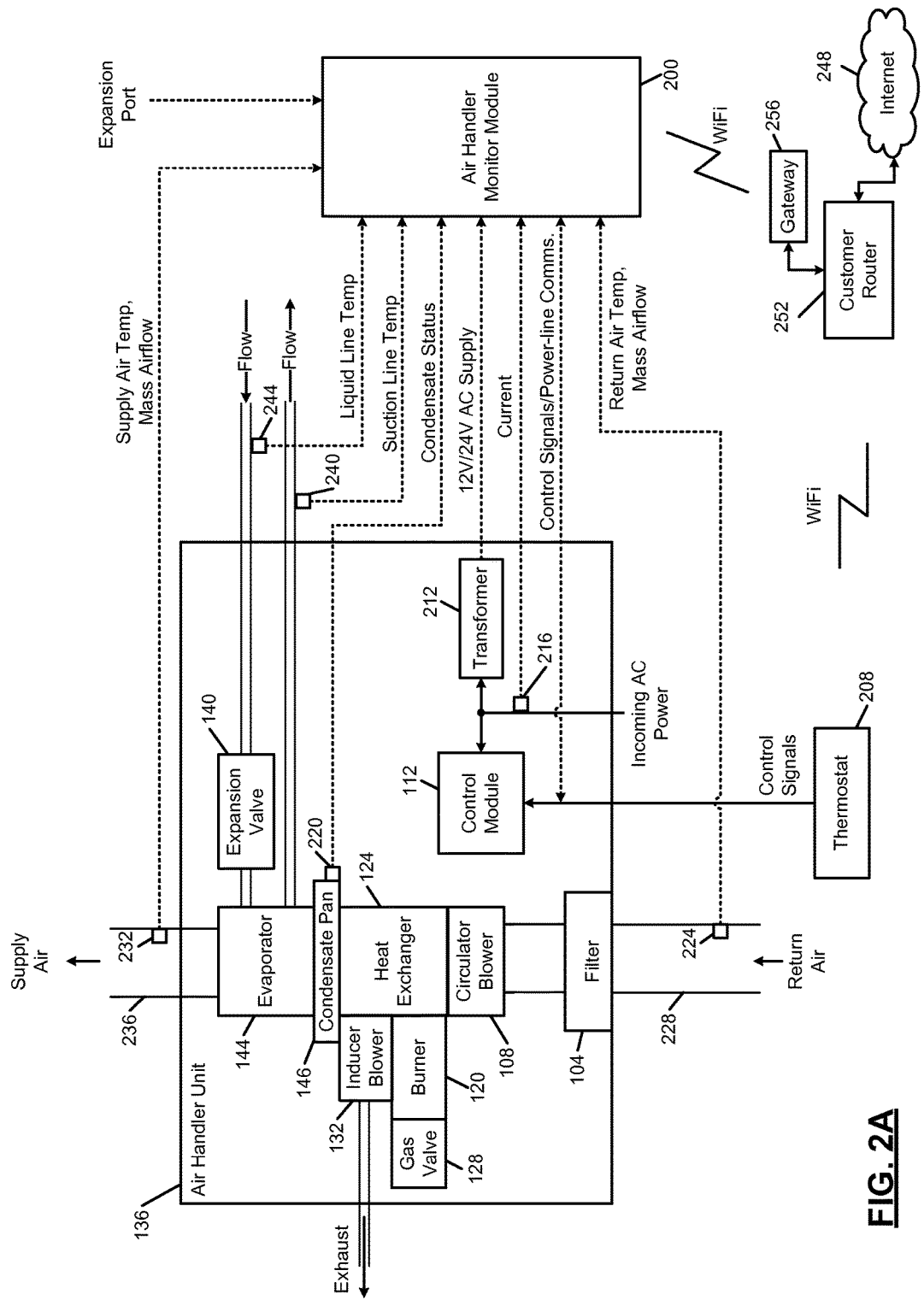
FIG. 2A is a functional block diagram of an example HVAC system including an implementation of an air handler monitor module.
Figure 2B:
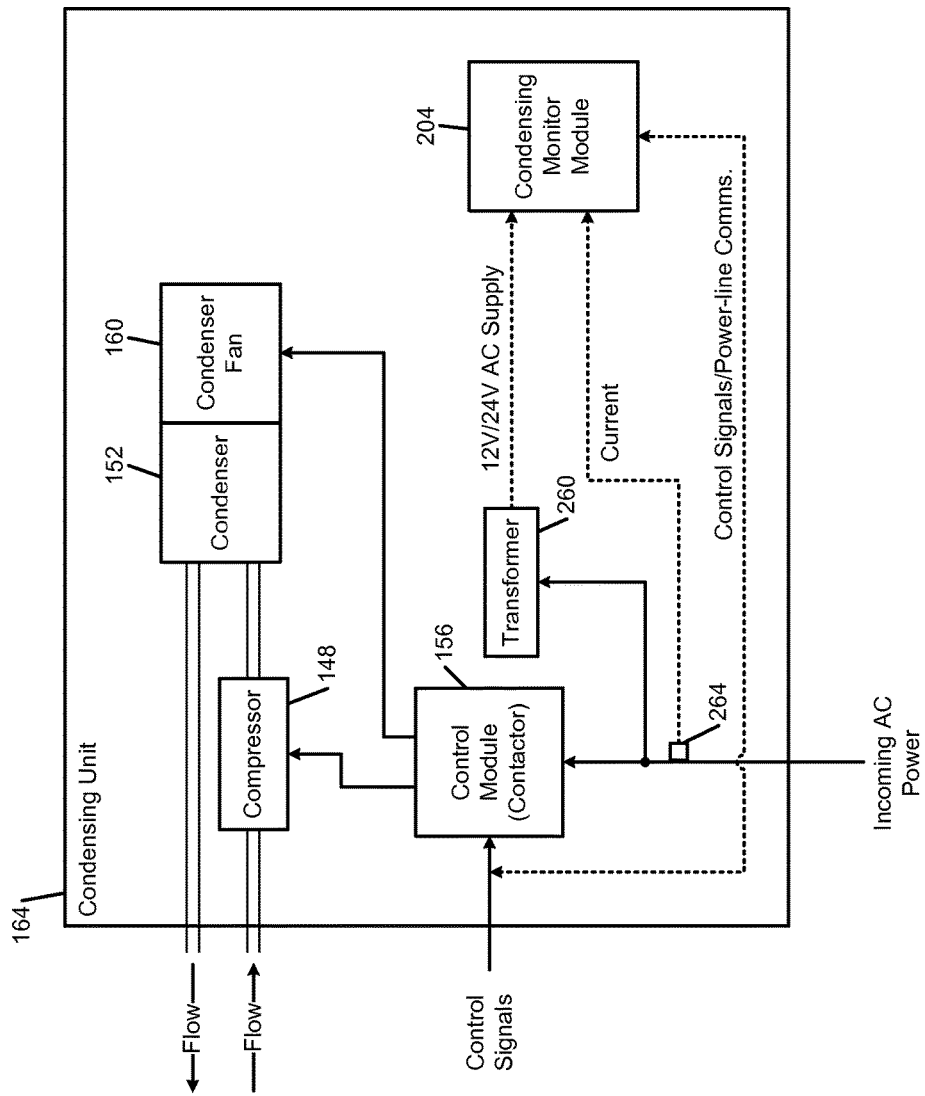
FIG. 2B is a functional block diagram of an example HVAC system including an implementation of a condensing monitor module.

FIGS. 2A-2B are functional block diagrams of an example monitoring system associated with an HVAC system of a building. The air handler unit 136 of FIG. 1 is shown for reference. Because the monitoring systems of the present disclosure can be used in retrofit applications, elements of the air handler unit 136 may remain unmodified. An air handler monitor module 200 and a condensing monitor module 204 can be installed in an existing system without needing to replace the original thermostat 116 shown in FIG. 1. To enable certain additional functionality, however, such as WiFi thermostat control and/or thermostat display of alert messages, the thermostat 116 of FIG. 1 may be replaced with a thermostat 208 having networking capability.

In many systems, the air handler unit 136 is located inside the building, while the condensing unit 164 is located outside the building. The present disclosure is not limited, and applies to other systems including, as examples only, systems where the components of the air handler unit 136 and the condensing unit 164 are located in close proximity to each other or even in a single enclosure. The single enclosure may be located inside or outside of the building. In various implementations, the air handler unit 136 may be located in a basement, garage, or attic. In ground source systems, where heat is exchanged with the earth, the air handler unit 136 and the condensing unit 164 may be located near the earth, such as in a basement, crawlspace, garage, or on the first floor, such as when the first floor is separated from the earth by only a concrete slab.

In FIG. 2A, the air handler monitor module 200 is shown external to the air handler unit 136, although the air handler monitor module 200 may be physically located outside of, in contact with, or even inside of an enclosure, such as a sheet metal casing, of the air handler unit 136.

When installing the air handler monitor module 200 in the air handler unit 136, power is provided to the air handler monitor module 200. For example, a transformer 212 can be connected to an AC line in order to provide AC power to the air handler monitor module 200. The air handler monitor module 200 may measure voltage of the incoming AC line based on this transformed power supply. For example, the transformer 212 may be a 10-to-1 transformer and therefore provide either a 12V or 24V AC supply to the air handler monitor module 200 depending on whether the air handler unit 136 is operating on nominal 120 volt or nominal 240 volt power. The air handler monitor module 200 then receives power from the transformer 212 and determines the AC line voltage based on the power received from the transformer 212.

For example, frequency, amplitude, RMS voltage, and DC offset may be calculated based on the measured voltages. In situations where 3-phase power is used, the order of the phases may be determined. Information about when the voltage crosses zero may be used to synchronize various measurements and to determine frequency of the AC power based on counting the number of zero crossings within a predetermine time period.

A current sensor 216 measures incoming current to the air handler unit 136. The current sensor 216 may include a current transformer that snaps around one power lead of the incoming AC power. The current sensor 216 may alternatively include a current shunt or a hall effect device. In various implementations, a power sensor (not shown) may be used in addition to or in place of the current sensor 216.

In various other implementations, electrical parameters (such as voltage, current, and power factor) may be measured at a different location, such as at an electrical panel providing power to the building from the electrical utility.

For simplicity of illustration, the control module 112 is not shown to be connected to the various components and sensors of the air handler unit 136. In addition, routing of the AC power to various powered components of the air handler unit 136, such as the circulator blower 108, the gas valve 128, and the inducer blower 132, are also not shown for simplicity. The current sensor 216 measures the current entering the air handler unit 136 and therefore represents an aggregate current of the current-consuming components of the air handler unit 136.

The control module 112 controls operation in response to signals from a thermostat 208 received over control lines. The air handler monitor module 200 monitors the control lines. The control lines may include a call for cool, a call for heat, and a call for fan. The control lines may include a line corresponding to a state of a reversing valve in heat pump systems.

The control lines may further carry calls for secondary heat and/or secondary cooling, which may be activated when the primary heating or primary cooling is insufficient. In dual fuel systems, such as systems operating from either electricity or natural gas, control signals related to the selection of the fuel may be monitored. Further, additional status and error signals may be monitored, such as a defrost status signal, which may be asserted when the compressor is shut off and a defrost heater operates to melt frost from an evaporator.

The control lines may be monitored by attaching leads to terminal blocks at the control module 112 at which the fan and heat signals are received. These terminal blocks may include additional connections where leads can be attached between these additional connections and the air handler monitor module 200. Alternatively, leads from the air handler monitor module 200 may be attached to the same location as the fan and heat signals, such as by putting multiple spade lugs underneath a signal screw head.

In various implementations, the cool signal from the thermostat 208 may be disconnected from the control module 112 and attached to the air handler monitor module 200. The air handler monitor module 200 can then provide a switched cool signal to the control module 112. This allows the air handler monitor module 200 to interrupt operation of the air conditioning system, such as upon detection of water by one of the water sensors. The air handler monitor module 200 may also interrupt operation of the air conditioning system based on information from the condensing monitor module 204, such as detection of a locked rotor condition in the compressor.

A condensate sensor 220 measures condensate levels in the condensate pan 146. If a level of condensate gets too high, this may indicate a plug or clog in the condensate pan 146 or a problem with hoses or pumps used for drainage from the condensate pan 146. The condensate sensor 220 may be installed along with the air handler monitor module 200 or may already be present. When the condensate sensor 220 is already present, an electrical interface adapter may be used to allow the air handler monitor module 200 to receive the readings from the condensate sensor 220. Although shown in FIG. 2A as being internal to the air handler unit 136, access to the condensate pan 146, and therefore the location of the condensate sensor 220, may be external to the air handler unit 136.

Additional water sensors, such as a conduction (wet floor) sensor may also be installed. The air handler unit 136 may be located on a catch pan, especially in situations where the air handler unit 136 is located above living space of the building. The catch pan may include a float switch. When enough liquid accumulates in the catch pan, the float switch provides an over-level signal, which may be sensed by the air handler monitor module 200.

A return air sensor 224 is located in a return air plenum 228. The return air sensor 224 may measure temperature and may also measure mass airflow. In various implementations, a thermistor may be multiplexed as both a temperature sensor and a hot wire mass airflow sensor. In various implementations, the return air sensor 224 is upstream of the filter 104 but downstream of any bends in the return air plenum 228.

A supply air sensor 232 is located in a supply air plenum 236. The supply air sensor 232 may measure air temperature and may also measure mass airflow. The supply air sensor 232 may include a thermistor that is multiplexed to measure both temperature and, as a hot wire sensor, mass airflow. In various implementations, such as is shown in FIG. 2A, the supply air sensor 232 may be located downstream of the evaporator 144 but upstream of any bends in the supply air plenum 236.

A differential pressure reading may be obtained by placing opposite sensing inputs of a differential pressure sensor (not shown) in the return air plenum 228 and the supply air plenum 236, respectively. For example only, these sensing inputs may be collocated or integrated with the return air sensor 224 and the supply air sensor 232, respectively. In various implementations, discrete pressure sensors may be placed in the return air plenum 228 and the supply air plenum 236. A differential pressure value can then be calculated by subtracting the individual pressure values.

The air handler monitor module 200 also receives a suction line temperature from a suction line temperature sensor 240. The suction line temperature sensor 240 measures refrigerant temperature in the refrigerant line between the evaporator 144 of FIG. 2A and the compressor 148 of FIG. 2B. A liquid line temperature sensor 244 measures the temperature of refrigerant in a liquid line traveling from the condenser 152 of FIG. 2B) to the expansion valve 140.

The air handler monitor module 200 may include one or more expansion ports to allow for connection of additional sensors and/or to allow connection to other devices, such as a home security system, a proprietary handheld device for use by contractors, or a portable computer.

The air handler monitor module 200 also monitors control signals from the thermostat 208. Because one or more of these control signals is also transmitted to the condensing unit 164 (shown in FIG. 2B), these control signals can be used for communication between the air handler monitor module 200 and the condensing monitor module 204 (shown in FIG. 2B).

The air handler monitor module 200 may transmit frames of data corresponding to periods of time. For example only, 7.5 frames may span one second (i.e., 0.1333 seconds per frame). Each frame of data may include voltage, current, temperatures, control line status, and water sensor status. Calculations may be performed for each frame of data, including averages, powers, RMS, and FFT. Then the frame is transmitted to the monitoring system.

The voltage and current signals may be sampled by an analog-to-digital converter at a certain rate, such as 1920 samples per second. The frame length may be measured in terms of samples. When a frame is 256 samples long, at a sample rate of 1920 samples per second, there will be 7.5 frames per second.

The sampling rate of 1920 Hz has a Nyquist frequency of 960 Hz and therefore allows an FFT bandwidth of up to approximately 960 Hz. An FFT limited to the time span of a single frame may be calculated for each frame. Then, for that frame, instead of transmitting all of the raw current data, only statistical data (such as average current) and frequency-domain data are transmitted.

This gives the monitoring system current data having a 7.5 Hz resolution, and gives frequency-domain data with approximately the 960 Hz bandwidth. The time-domain current and/or the derivative of the time-domain current may be analyzed to detect impending or existing failures. In addition, the current and/or the derivative may be used to determine which set of frequency-domain data to analyze. For example, certain time-domain data may indicate the approximate window of activation of a hot surface igniter, while frequency-domain data is used to assess the state of repair of the hot surface igniter.

In various implementations, the air handler monitor module 200 may only transmit frames during certain periods of time. These periods may be critical to operation of the HVAC system. For example, when thermostat control lines change, the air handler monitor module 200 may record data and transmit frames for a predetermined period of time after that transition. Then, if the HVAC system is operating, the air handler monitor module 200 may intermittently record data and transmit frames until operation of the HVAC system has completed.

The air handler monitor module 200 transmits data measured by both the air handler monitor module 200 itself and the condensing monitor module 204 over a wide area network 248, such as the Internet (referred to as the Internet 248). The air handler monitor module 200 may access the Internet 248 using a router 252 of the customer. The customer router 252 may already be present to provide Internet access to other devices (not shown) within the building, such as a customer computer and/or various other devices having Internet connectivity, such as a DVR (digital video recorder) or a video gaming system.

The air handler monitor module 200 communicates with the customer router 252 using a proprietary or standardized, wired or wireless protocol, such as Bluetooth, ZigBee (IEEE 802.15.4), 900 Megahertz, 2.4 Gigahertz, WiFi (IEEE 802.11). In various implementations, a gateway 256 is implemented, which creates a wireless network with the air handler monitor module 200. The gateway 256 may interface with the customer router 252 using a wired or wireless protocol, such as Ethernet (IEEE 802.3).

The thermostat 208 may also communicate with the customer router 252 using WiFi. Alternatively, the thermostat 208 may communicate with the customer router 252 via the gateway 256. In various implementations, the air handler monitor module 200 and the thermostat 208 do not communicate directly. However, because they are both connected through the customer router 252 to a remote monitoring system, the remote monitoring system may allow for control of one based on inputs from the other. For example, various faults identified based on information from the air handler monitor module 200 may cause the remote monitoring system to adjust temperature set points of the thermostat 208 and/or display warning or alert messages on the thermostat 208.

In various implementations, the transformer 212 may be omitted, and the air handler monitor module 200 may include a power supply that is directly powered by the incoming AC power. Further, power-line communications may be conducted over the AC power line instead of over a lower-voltage HVAC control line.

In various implementations, the current sensor 400 may be omitted, and instead a voltage sensor (not shown) may be used. The voltage sensor measures the voltage of an output of a transformer internal to the control module 112, the internal transformer providing the power (e.g., 24 Volts) for the control signals. The air handler monitor module 200 may measure the voltage of the incoming AC power and calculate a ratio of the voltage input to the internal transformer to the voltage output from the internal transformer. As the current load on the internal transformer increases, the impedance of the internal transformer causes the voltage of the output power to decrease. Therefore, the current draw from the internal transformer can be inferred from the measured ratio (also called an apparent transformer ratio). The inferred current draw may be used in place of the measured aggregate current draw described in the present disclosure.

In FIG. 2B, the condensing monitor module 204 is installed in the condensing unit 164. A transformer 260 converts incoming AC voltage into a stepped-down voltage for powering the condensing monitor module 204. In various implementations, the transformer 260 may be a 10-to-1 transformer. A current sensor 264 measures current entering the condensing unit 164. The condensing monitor module 204 may also measure voltage from the supply provided by the transformer 260. Based on measurements of the voltage and current, the condensing monitor module 204 may calculate power and/or may determine power factor.

In various implementations, the condensing monitor module 204 may receive ambient temperature data from a temperature sensor (not shown). When the condensing monitor module 204 is located outdoors, the ambient temperature represents an outside ambient temperature. The temperature sensor supplying the ambient temperature may be located outside of an enclosure of the condensing unit 164. Alternatively, the temperature sensor may be located within the enclosure, but exposed to circulating air. In various implementations the temperature sensor may be shielded from direct sunlight and may be exposed to an air cavity that is not directly heated by sunlight. Alternatively or additionally, online (including Internet-based) weather data based on geographical location of the building may be used to determine sun load, outside ambient air temperature, precipitation, and humidity.

In various implementations, the condensing monitor module 204 may receive refrigerant temperature data from refrigerant temperature sensors (not shown) located at various points, such as before the compressor 148 (referred to as a suction line temperature), after the compressor 148 (referred to as a compressor discharge temperature), after the condenser 152 (referred to as a liquid line out temperature), and/or at one or more points along a coil of the condenser 152. The location of temperature sensors may be dictated by a physical arrangement of the condenser coils. Additionally or alternatively to the liquid line out temperature sensor, a liquid line in temperature sensor may be used. An approach temperature may be calculated, which is a measure of how close the condenser 152 has been able to bring the liquid line out temperature to the ambient air temperature.

During installation, the location of the temperature sensors may be recorded. Additionally or alternatively, a database may be maintained that specifies where temperature sensors are placed. This database may be referenced by installers and may allow for accurate remote processing of the temperature data. The database may be used for both air handler sensors and compressor/condenser sensors. The database may be prepopulated by the monitoring company or may be developed by trusted installers, and then shared with other installation contractors.

As described above, the condensing monitor module 204 may communicate with the air handler monitor module 200 over one or more control lines from the thermostat 208. In these implementations, data from the condensing monitor module 204 is transmitted to the air handler monitor module 200, which in turn uploads the data over the Internet 248.

In various implementations, the transformer 260 may be omitted, and the condensing monitor module 204 may include a power supply that is directly powered by the incoming AC power. Further, power-line communications may be conducted over the AC power line instead of over a lower-voltage HVAC control line.

Figure 2C:
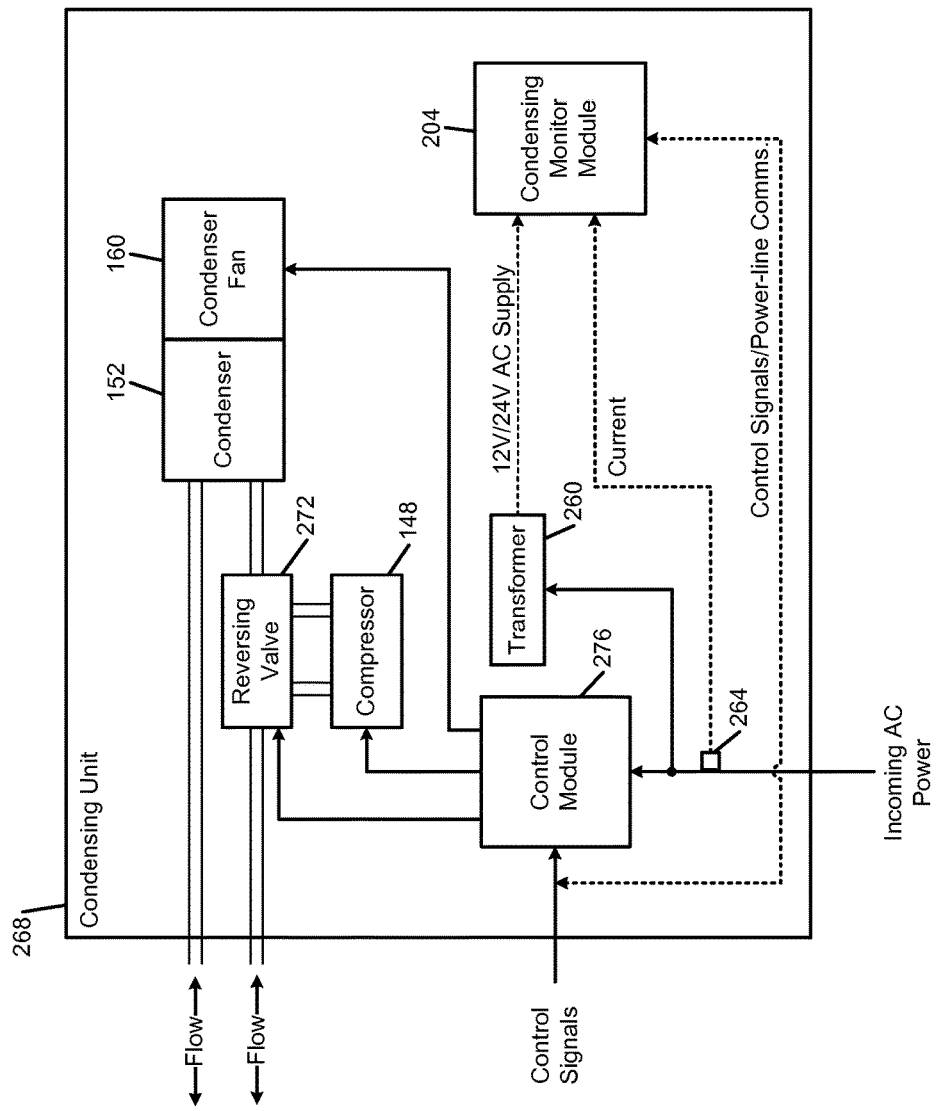
FIG. 2C is a functional block diagram of an example HVAC system based on a heat pump.

In FIG. 2C, an example condensing unit 268 is shown for a heat pump implementation. The condensing unit 268 may be configured similarly to the condensing unit 164 of FIG. 2B. Similarly to FIG. 2B, the transformer 260 may be omitted in various implementations. Although referred to as the condensing unit 268, the mode of the heat pump determines whether the condenser 152 of the condensing unit 268 is actually operating as a condenser or as an evaporator. A reversing valve 272 is controlled by a control module 276 and determines whether the compressor 148 discharges compressed refrigerant toward the condenser 152 (cooling mode) or away from the condenser 152 (heating mode).

Figure 3:
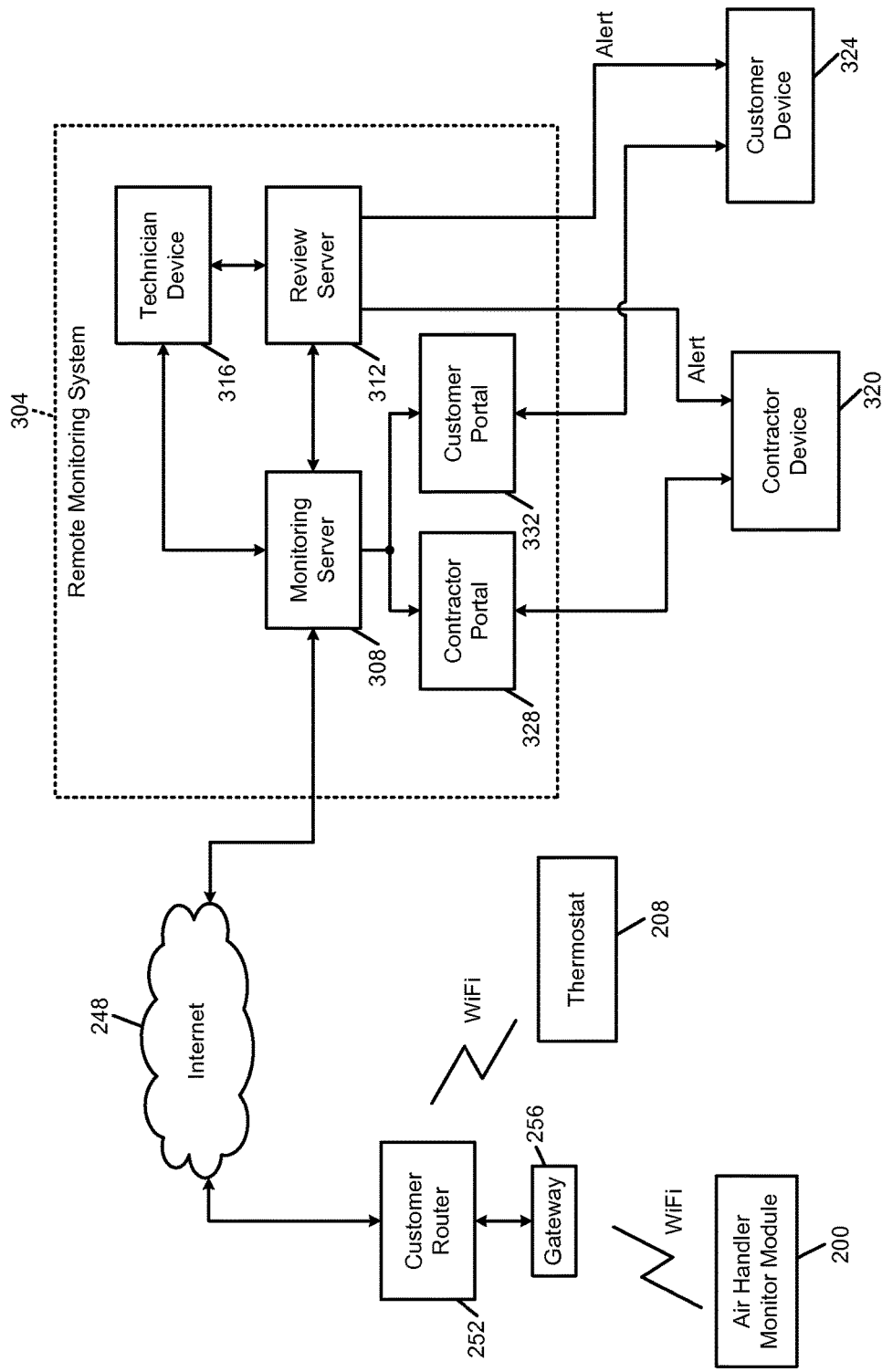
FIG. 3 is a high level functional block diagram of an example system including an implementation of a remote monitoring system.

In FIG. 3, the air handler monitor module 200 and the thermostat 208 are shown communicating, using the customer router 252, with a remote monitoring system 304 via the Internet 248. In other implementations, the condensing monitor module 204 may transmit data from the air handler monitor module 200 and the condensing monitor module 204 to an external wireless receiver. The external wireless receiver may be a proprietary receiver for a neighborhood in which the building is located, or may be an infrastructure receiver, such as a metropolitan area network (such as WiMAX), a WiFi access point, or a mobile phone base station.

The remote monitoring system 304 includes a monitoring server 308 that receives data from the air handler monitor module 200 and the thermostat 208 and maintains and verifies network continuity with the air handler monitor module 200. The monitoring server 308 executes various algorithms to identify problems, such as failures or decreased efficiency, and to predict impending faults.

The monitoring server 308 may notify a review server 312 when a problem is identified or a fault is predicted. This programmatic assessment may be referred to as an advisory. Some or all advisories may be triaged by a technician to reduce false positives and potentially supplement or modify data corresponding to the advisory. For example, a technician device 316 operated by a technician is used to review the advisory and to monitor data (in various implementations, in real-time) from the air handler monitor module 200 via the monitoring server 308.

The technician using the technician device 316 reviews the advisory. If the technician determines that the problem or fault is either already present or impending, the technician instructs the review server 312 to send an alert to either or both of a contractor device 320 or a customer device 324. The technician may be determine that, although a problem or fault is present, the cause is more likely to be something different than specified by the automated advisory. The technician can therefore issue a different alert or modify the advisory before issuing an alert based on the advisory. The technician may also annotate the alert sent to the contractor device 320 and/or the customer device 324 with additional information that may be helpful in identifying the urgency of addressing the alert and presenting data that may be useful for diagnosis or troubleshooting.

In various implementations, minor problems may be reported to the contractor device 320 only so as not to alarm the customer or inundate the customer with alerts. Whether the problem is considered to be minor may be based on a threshold. For example, an efficiency decrease greater than a predetermined threshold may be reported to both the contractor and the customer, while an efficiency decrease less than the predetermined threshold is reported to only the contractor.

In some circumstances, the technician may determine that an alert is not warranted based on the advisory. The advisory may be stored for future use, for reporting purposes, and/or for adaptive learning of advisory algorithms and thresholds. In various implementations, a majority of generated advisories may be closed by the technician without sending an alert.

Based on data collected from advisories and alerts, certain alerts may be automated. For example, analyzing data over time may indicate that whether a certain alert is sent by a technician in response to a certain advisory depends on whether a data value is on one side of a threshold or another. A heuristic can then be developed that allows those advisories to be handled automatically without technician review. Based on other data, it may be determined that certain automatic alerts had a false positive rate over a threshold. These alerts may be put back under the control of a technician.

In various implementations, the technician device 316 may be remote from the remote monitoring system 304 but connected via a wide area network. For example only, the technician device may include a computing device such as a laptop, desktop, or tablet.

With the contractor device 320, the contractor can access a contractor portal 328, which provides historical and real-time data from the air handler monitor module 200. The contractor using the contractor device 320 may also contact the technician using the technician device 316. The customer using the customer device 324 may access a customer portal 332 in which a graphical view of the system status as well as alert information is shown. The contractor portal 328 and the customer portal 332 may be implemented in a variety of ways according to the present disclosure, including as an interactive web page, a computer application, and/or an app for a smartphone or tablet.

In various implementations, data shown by the customer portal may be more limited and/or more delayed when compared to data visible in the contractor portal 328. In various implementations, the contractor device 320 can be used to request data from the air handler monitor module 200, such as when commissioning a new installation.

Figure 4A:
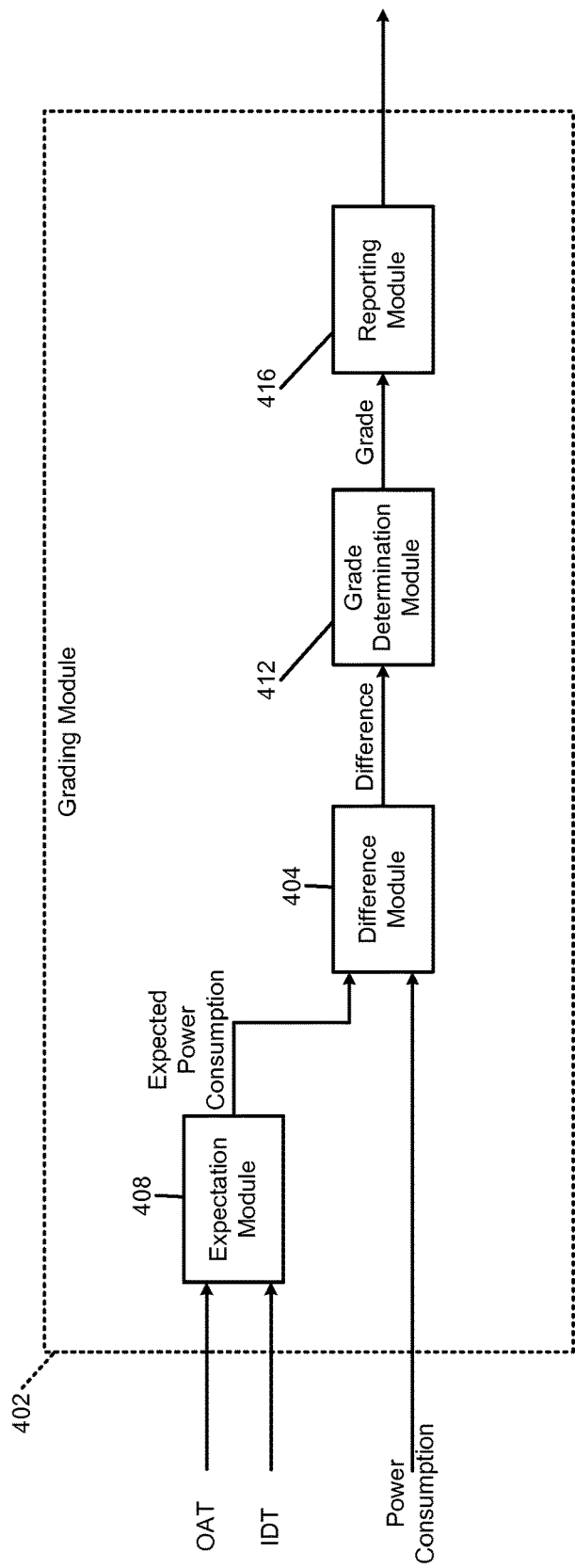
FIGS. 4A-4C are functional block diagrams of example grading modules that grade a heat pump of a building.
Figure 4B:
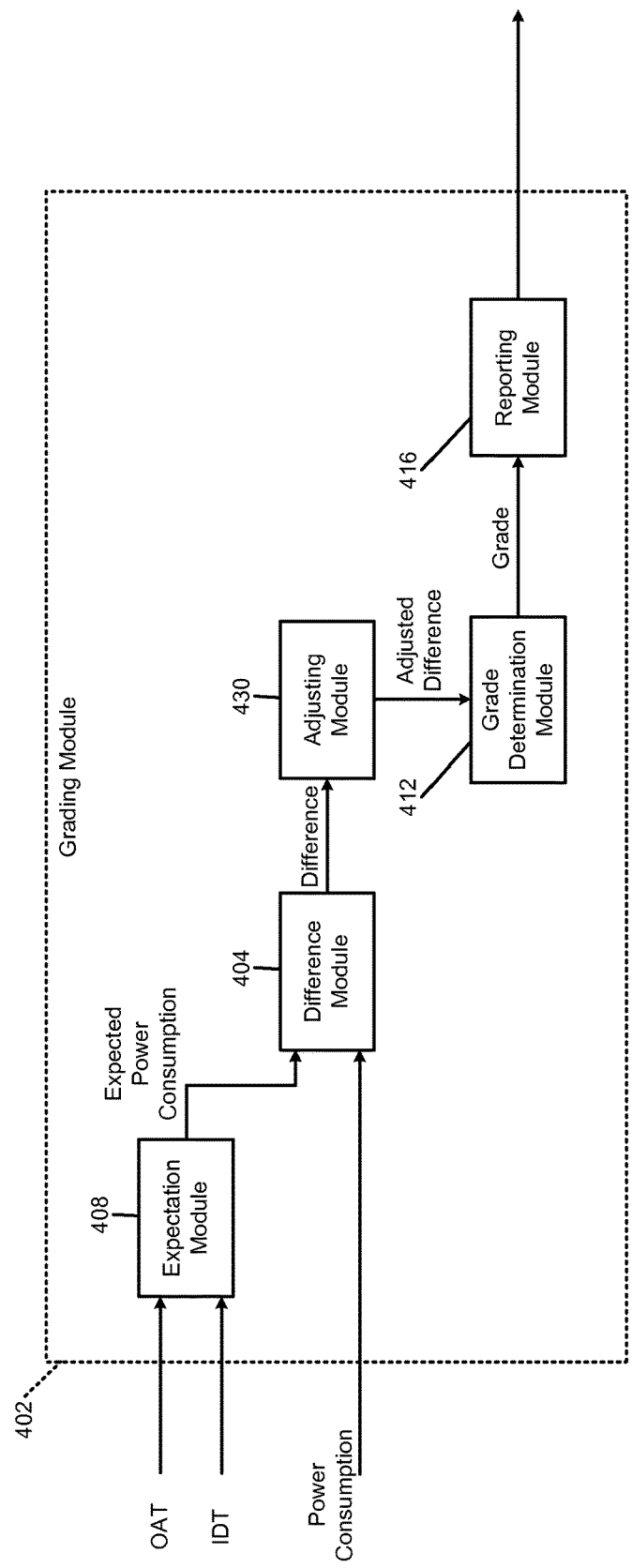
Figure 4C:
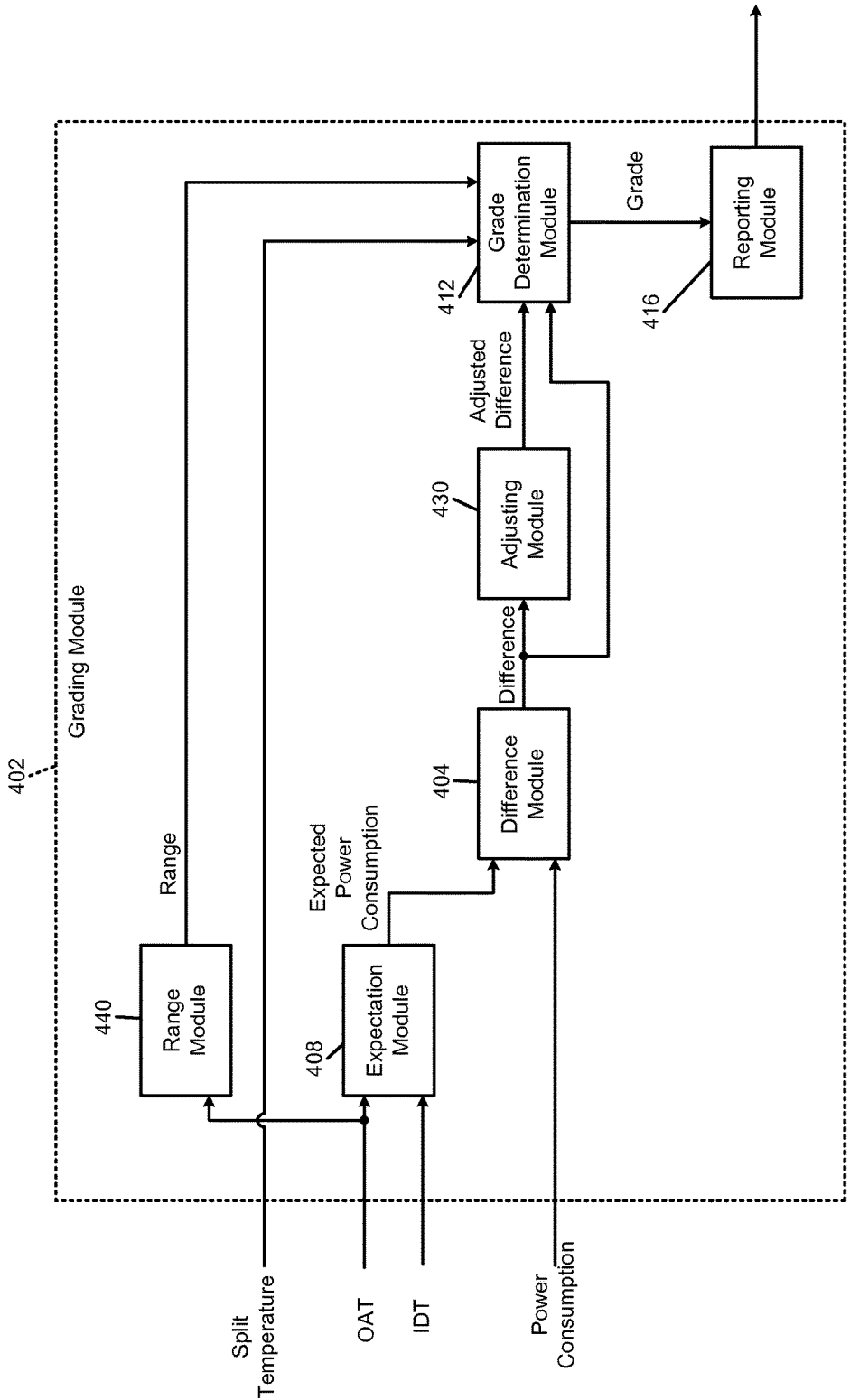

FIGS. 4A-4C include functional block diagrams of example implementations of a grading module 402. The grading module 402 may be implemented, for example, in the monitoring server 308. The grading module 402 grades a heat pump of a building. An example condensing unit of a heat pump is described above in conjunction with the example of FIG. 2C. The heat pump also includes an air handler unit. Example air handler units are described above.

The grading module 402 grades the heat pump based on a comparison of a power consumption of the heat pump and an expected power consumption of the heat pump. The grading module 402 generates a report for the heat pump including the grade of the heat pump. The report may help an owner/operator of the building visualize trends, changes, and a time history of grades of the heat pump. The report may also include other information, such as grades of heat pumps of other buildings within a predetermined distance and/or other suitable information.

In FIG. 4A, a difference module 404 determines a power difference between an average power consumption of the heat pump during a day and an expected average power consumption of the heat pump for that day. The difference module 404 determines a power difference each day. While the example time period of a day will be discussed, the heat pump may be graded based on average power consumption and expected average power consumption of the heat pump over another suitable predetermined time period.

The difference module 404 may set the power difference for a day, for example, equal to the average power consumption of the day minus the expected average power consumption for the day. The average power consumption of the heat pump may be an average of the measured power consumption of electrical components of the heat pump during the day. The expected average power consumption may be an expected average power consumption of the heat pump for the day.

The difference module 404 may monitor one or more parameters measured by sensors associated with the heat pump and determine the average power consumption of the heat pump during a day based on the measured parameters. For example, the difference module 404 may determine the average power consumption of the heat pump based on current flow to the condenser unit of the heat pump, voltage input to the condenser unit of the heat pump, current flow to the air handler unit of the heat pump, and voltage input to the air handler unit of the heat pump. Additionally or alternatively, the air handler monitor module 200 or the condensing monitor module 204 of the heat pump may provide the power consumption measurements to the grading module 402, and the grading module 402 may average the measurements each day.

An expectation module 408 determines the expected average power consumption of the heat pump for each day. The expectation module 408 determines the expected average power consumption of the heat pump for a day based on one or more outdoor ambient temperatures (OATs) of the building of the heat pump during the day and/or one or more indoor temperatures (IDTs) of the building of the heat pump for the day. The indoor temperature may be, for example, the setpoint temperature of a thermostat of the building or a return air temperature (RAT) of the building. The OAT and the RAT may be measured using temperature sensors as described above.

The OAT and the IDT may be sampled every predetermined period by the air handler monitor module 200 and/or the condensing monitor module 204. The expectation module 408 may determine the expected average power consumption for the day, for example, based on an average of the OATs of the day and an average of the IDTs of the day. The expectation module 408 determines the expected average power consumption using a stored mapping that relates OAT and IDT to expected average power consumption of the heat pump.

The mapping may be populated based on data provided by a manufacturer of the heat pump. This data may include a first data point including a first expected power consumption of the heat pump for a day given an average OAT of 17 degrees Fahrenheit (° F.) and an average IDT of 70° F. and a second data point including a second expected power consumption of the heat pump for a day given an average OAT of 47° F. and an average IDT of 70° F. Other suitable data points may be provided in various implementations. Based on the data points provided by the manufacturer, the mapping can be populated for other OATs and other IDTs and stored for use by the expectation module 408.

While the example of grading a heat pump is shown and discussed herein, the present application is also applicable to grading an A/C system, as discussed further below. In the case of an A/C system, in addition to the data provided by a manufacturer of the A/C system, the mapping may be populated further based on a SEER rating of the A/C system and a tonnage rating of the A/C system. The expected average power consumption of the A/C system can then be determined using OAT and (optionally) IDT.

A grade determination module 412 generates a grade for the heat pump for the day based on the power difference of the day. For example, in FIG. 4A, the grade determination module 412 may determine the grade of the heat pump by subtracting an absolute value of the power difference from 100. The grade may therefore be a numerical value between 0 and 100, where 100 corresponds to a best grade for the heat pump and 0 corresponds to a worst grade for the heat pump.

The numerical value can be converted into, for example, a letter grade, such as A, B, C, D, or E. Predetermined ranges of numeric values can be defined for each possible letter grade. The grade determination module 412 may determine a letter grade for the heat pump for the day according to the predetermined range within which the numeric value falls.

A reporting module 416 generates a displayable report for the heat pump including the grade of the heat pump for the day. The reporting module 416 may also generate the report to include other information, such as one or more grades of the heat pump for one or more previous days to provide a time history of the grades of the heat pump over multiple days. The report may additionally or alternatively include other information, such as a change in the grades over a predetermined period, trends in the grades of the heat pump, and/or grades determined for other heat pumps of buildings located near the building on the same day(s). The reporting module 416 may generate the report daily, monthly, weekly, seasonally, every predetermined number of days or at another suitable frequency. The report may be displayed on a display, such as the contractor device 320 and/or the customer device 324.

In FIG. 4B, the grade determination module 412 determines the grade of the heat pump for the day based on an adjusted power difference for the day. An adjusting module 430 determines the adjusted power difference for the day based on the power difference for the day.

For example, when the average power consumption of the day is greater than or equal to the expected average power consumption of the day (such that the power difference is positive or zero), the adjusting module 430 sets the adjusted difference for the day equal to the power difference multiplied by a first predetermined gain. The first predetermined gain is a positive value calibrated to scale the positive power difference into a numeric value between 0 and 100.

When the average power consumption of the day is less than the expected average power consumption of the day (such that the power difference is negative), the adjusting module 430 sets the adjusted difference for the day equal to the power difference multiplied by a second predetermined gain. The second predetermined gain is a negative value calibrated to scale the negative power difference into a numeric value between 0 and 100.

Use of the adjusted power difference may help adjust the grade of the heat pump for different types of faults which may affect power consumption differently. For example, low side faults (e.g., caused by low charge) may decrease power consumption to a lesser extent than high side faults (e.g., caused by high charge) may increase power consumption. The first predetermined gain may therefore be set to greater than or less than the second predetermined gain.

The grade determination module 412 may determine the grade of the heat pump for the day by subtracting the adjusted power difference of the day from 100. The grade determination module 412 may also convert the numerical value to a letter grade, as discussed above.

In FIG. 4C, the grade determination module 412 may determine an initial grade for the heat pump and the day using the power difference (as discussed above with FIG.

4A) or using the adjusted power difference (as discussed above with FIG. 4B). The grade determination module 412 determines the (final) grade of the heat pump and the day based on the initial grade for the day.

For example, when an average split temperature of the day is within a temperature range for the day, the grade determination module 412 may set the grade of the heat pump for the day equal to the initial grade of the heat pump for the day. A range module 440 may determine the temperature range for the day based on the average OAT of the building for the day. The temperature range includes an upper temperature limit and a lower temperature limit that bound the temperature range. The range module 440 may determine the temperature range for the day, for example, using one or more functions or mappings that relate OAT to temperature range.

The split temperature may refer to a temperature difference between the RAT and a supply air temperature. The supply air temperature may be measured using a supply air temperature sensor. The supply air temperature may be sampled every predetermined period by the air handler monitor module 200. The grade determination module 412 may average the temperatures differences between the supply air temperature and the RAT sampled during the day to determine the average split temperature for the day. Alternatively, the air handler monitor module 200 may monitor the average split temperature each day and provide the average split temperatures to the grade determination module 412.

When the average split temperature of the day is less than the lower temperature limit of the temperature range for the day, the grade determination module 412 decreases the grade relative to the initial grade. For example, the grade determination module 412 may set the grade of the heat pump for the day using the equation:

Grade=Initial−Gain$_{Low}$*(Lower Limit−TS), where Grade is the (final) grade of the heat pump for the day, Initial is the initial grade of the heat pump for the day (determined based on power), Gain$_{Low}$ is a predetermined lower gain value, Lower Limit is the lower temperature limit of the temperature range, and TS is the average split temperature. Split temperature may also be referred to as temperature split.

When the average split temperature of the day is greater than the upper temperature limit of the temperature range for the day, the grade determination module 412 decreases the grade relative to the initial grade. For example, the grade determination module 412 may set the grade of the heat pump for the day using the equation:

Grade=Initial−Gain$_{High}$*(Upper Limit−TS), where Grade is the (final) grade of the heat pump for the day, Initial is the initial grade of the heat pump for the day, Gain$_{High}$ is a predetermined upper gain value, Upper Limit is the upper temperature limit of the temperature range, and TS is the average split temperature.

The predetermined upper and lower gain values may be fixed or variable values. The predetermined lower gain value may be less than the predetermined upper gain value such that a low average temperature split decreases the grade of the heat pump to a greater extent than a high average temperature split.

When the average power consumption of the day is greater than the expected average power consumption of the day (such that the power difference is positive), the grade determination module 412 may increase the predetermined upper gain value. For example only, the grade determination module 412 may double the predetermined upper gain value. Under these circumstances, the split temperature and power consumption are moving away from normal conditions, suggesting a high side fault, such as low condenser airflow or a high refrigerant charge. When the average power consumption of the day is less than the expected average power consumption of the day (such that the power difference is negative), the grade determination module 412 may increase the predetermined lower gain value. For example only, the grade determination module 412 may double the predetermined lower gain value. Under these circumstances, the split temperature and power consumption are moving away from normal conditions, suggesting a low side fault, such as low evaporator airflow or a low refrigerant charge.

In various implementations, a capacity of the heat pump and an expected capacity of the heat pump may be used in place of the temperature range and the split temperature. For example, the grade determination module 412 may set the grade of the heat pump for the day using the equation:

Grade=Initial−Gain*(EC−MC), where Grade is the (final) grade of the heat pump for the day, Initial is the initial grade of the heat pump for the day, Gain is a predetermined upper gain, EC is an expected capacity of the heat pump for the day, and MC is a measured capacity of the heat pump for the day. The expected capacity of the heat pump may be determined as a function of the OAT and the IDT. The measured capacity of the heat pump for the day may be determined, for example, using the equation:

MC=Scalar*MAF*TS, where MC is the measured capacity of the heat pump for the day, Scalar is a predetermined value, MAF is a measured air flow of the day, and TS is the average split temperature of the day.

FIG. 4C has been discussed in terms of determining the grade of the heat pump based on comparing a temperature split with a temperature range. Additionally or alternatively, the grade determination module 412 may determine the grade of the heat pump based on a comparison of another operating parameter associated with the heat pump with a range for that operating parameter. Other example operating parameters include, for example, a run time of the heat pump during a day, a run time of an auxiliary HVAC system used to supplement operation of the heat pump during a day, and a power factor of the heat pump during the day. When another operating parameter is used, the grade determination module 412 may determine the (final) grade for the heat pump in a way that is similar to those discussed above in conjunction with the split temperature and the temperature range. For example, when a run time of the heat pump is greater than an expected run time of the heat pump at a given OAT and IDT, the grade determination module 412 may decrease the grade of the heat pump. For another example, when a run time of the auxiliary HVAC system is greater than an expected run time of the heat pump at a given OAT and IDT, the grade determination module 412 may decrease the grade of the heat pump.

Figure 5:
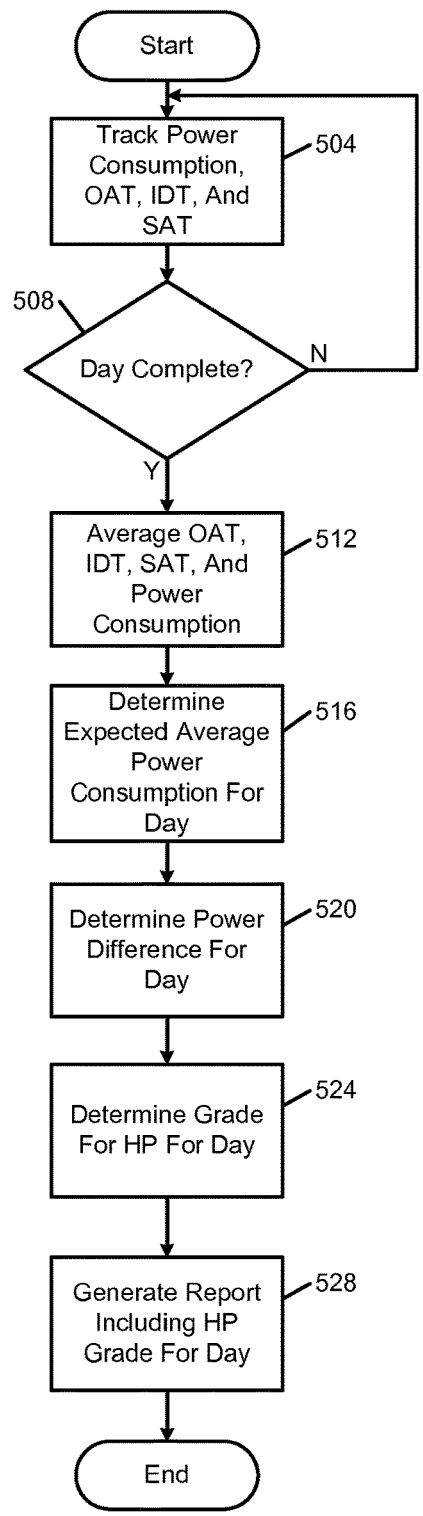
FIG. 5 is a flowchart depicting an example method of grading the heat pump of a building.

FIG. 5 includes a flowchart depicting an example method of grading the heat pump of the building for a day. Control may begin at 504 where control tracks the power consumption of the heat pump, the OAT, the supply air temperature, and the IDT. Control may average power consumption samples to determine the average amount of power consumption of the heat pump.

At 508, control determines whether the day is complete. If 508 is true, control continues with 512. If 512 is false, control returns to 504 and continues tracking the power consumption of the heat pump during the day, the OAT, the supply air temperature, and the IDT.

Control averages the OATs of the day and averages the IDTs of the day at 512 to produce an average OAT for the day and an average IDT for the day. Control may also average the power consumption values to determine the average power consumption at 512. At 516, control determines the expected average power consumption of the heat pump for the day. Control determines the expected average power consumption of the heat pump for the day using a mapping that relates OAT and IDT to expected average power consumption, as discussed above.

At 520, control determines the power difference for the day between the average power consumption of the heat pump for the day and the expected average power consumption of the heat pump for the day. For example, control may set the power difference equal to the average power consumption minus the expected average power consumption.

At 524, control generates the grade of the heat pump for the day based on the power difference of the day. For example, control may set the grade based on 100 minus an absolute value of the power difference, as described above. As another example, control may determine the adjusted power difference and determine the grade based on 100 minus the adjusted power difference, as also described above. As another example, control may determine the grade based on whether the average split temperature of the day is within the temperature range for the day, as also described above. Additionally or alternatively, control may determine the grade based on whether one or more other parameters associated with the heat pump are within respective ranges for the day. Examples of other parameters may include, for example, a run time of an auxiliary HVAC system of the day, a run time of the heat pump of the day, and a power factor of the heat pump of the day.

Control generates a report including the grade of the heat pump for the day at 528. Control may generate the report to include other information, such as one or more changes in grades of the heat pump over a period of days, one or more trends in the grades of the heat pump over a period of days, and/or one or more grades of heat pumps of other local buildings. The report can be displayed on a display, such as a display of the customer device 324 and/or a display of the contractor device 320.

Figure 6:
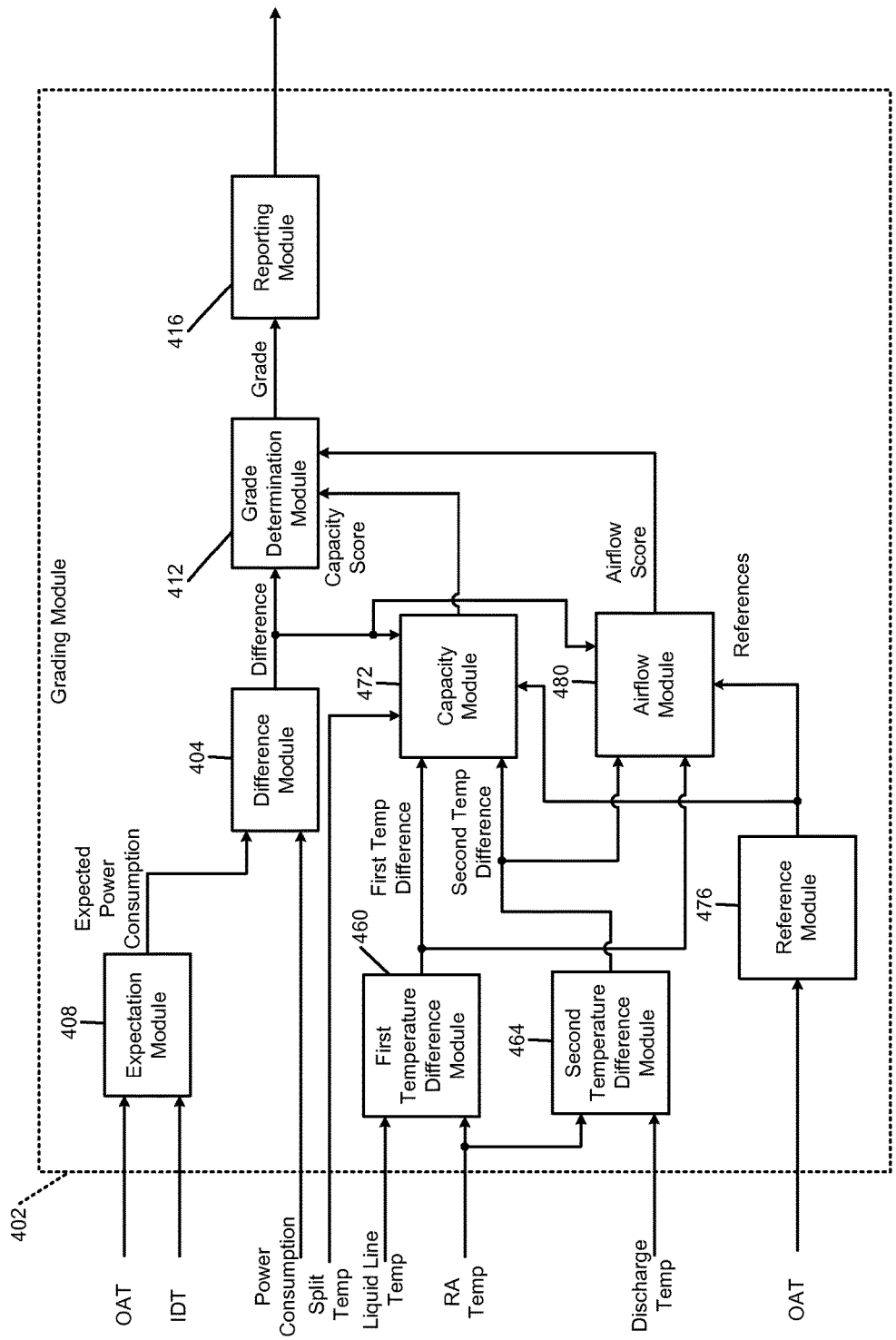
FIG. 6 is a functional block diagram of an example grading module that grades a heat pump of a building.

FIG. 6 includes a functional block diagram of an example implementation of the grading module 402. The grade determination module 412 determines the grade of the heat pump for the day based on the power difference for the day, a capacity score for the day, and an airflow score for the day.

A first temperature difference module 460 determines a first temperature difference between an average liquid line temperature of the heat pump during a day and an average return air temperature for that day. The first temperature difference module 460 determines a first temperature difference each day.

The first temperature difference module 460 may set the first temperature difference for a day, for example, equal to the average liquid line temperature of the day minus the average return air temperature for the day. The average liquid line temperature may be an average of the measured liquid line temperature of the heat pump during the day. The average return air temperature may be an average of the measured return air temperature of the heat pump during the day.

The first temperature difference module 460 may obtain the liquid line temperature from a sensor, such as the liquid line temperature sensor 244, and average the liquid line temperatures measured over a day. The first temperature difference module 460 may obtain the return air temperature from a sensor, such as the return air temperature sensor 224, and average the return air temperatures measured over a day. Additionally or alternatively, the air handler monitor module 200 or the condensing monitor module 204 of the heat pump may provide first temperature differences between the liquid line temperature and the return air temperature to the first temperature difference module 460, and the first temperature difference module 460 may average the first temperature differences each day.

A second temperature difference module 464 determines a second temperature difference between an average discharge temperature of the heat pump during a day and the average return air temperature for that day. The second temperature difference module 464 determines a second temperature difference each day.

The second temperature difference module 464 may set the second temperature difference for a day, for example, equal to the average discharge temperature of the day minus the average return air temperature for the day. The average discharge temperature may be an average of the measured second temperature of the heat pump during the day. The second temperature difference module 464 may obtain the discharge temperature from a sensor and average the discharge temperatures measured over a day. Additionally or alternatively, the air handler monitor module 200 or the condensing monitor module 204 of the heat pump may provide second temperature differences between the discharge temperature and the return air temperature to the second temperature difference module 464, and the second temperature difference module 464 may average the second temperature differences each day.

A capacity module 472 determines a capacity score for a day based on the first temperature difference of the day, the second temperature difference of the day, the average split temperature of the day, a reference split temperature for the day, a reference first temperature difference for the day, and a reference second temperature difference for the day. The capacity module 472 may determine the capacity score using one or more functions or mappings that relate the above parameters to capacity scores. Additionally or alternatively, the capacity module 472 may determine the capacity score based on the above parameters using fuzzy logic. For example only, the capacity module 472 may determine the capacity score for a day based on or using the relationship:

$$\text{Capacity} = -PD - TSW1*(TS - TSRef + TSOffset1) - TD1W1*(TD1 + TD1Offset1 - TD1Ref) + TD2W1*(TD2 - TD2Ref),$$

where Capacity is the capacity score for the day, PD is the power difference for the day, TSW1 is a first predetermined weighting value for split temperatures, TS is the average split temperature for the day, TSRef is the reference split temperature for the day, and TSOffset1 is a first predetermined offset value for split temperatures. TD1W1 is a first predetermined weighting value for first temperature differences, TD1 is the average first temperature difference for the day, TD1Offset1 is a first predetermined offset value for first temperature differences, TD1Ref is the reference first temperature difference for the day, TD2W1 is a first predetermined weighting value for second temperature differences, TD2 is the average second temperature difference for the day, and TD2Ref is the reference second temperature difference for the day. The capacity score may correspond to a decrease in the grade of the heat pump attributable to the capacity of the heat pump being too high or too low.

The first predetermined weighting value for split temperatures may be greater than the first predetermined weighting value for first temperature differences, and the first predetermined weighting value for first temperature differences may be greater than the first predetermined weighting value for second temperature differences. For example only, the first predetermined weighting value for split temperatures may be approximately 5, the first predetermined weighting value for first temperature differences may be 1, and the first predetermined weighting value for second temperature differences may be approximately 0.1. However, the first predetermined weighting values may be other suitable values. The first predetermined offset value for split temperatures may be, for example, 4 or another suitable value. The first predetermined offset value for first temperature differences may be, for example, 3 or another suitable value. In various implementations, a first predetermined offset value for second temperature differences may also be added to or subtracted from the difference between the average second temperature difference and the reference second temperature difference.

A reference module 476 determines the reference split temperature, the reference first temperature difference, and the reference second temperature difference. The reference module 476 determines the reference split temperature, the reference first temperature difference, and the reference second temperature difference for each day. The reference module 476 determines the reference split temperature, the reference first temperature difference, and the reference second temperature difference for a day based on an average OAT for the day. For example only, the reference module 476 determines the reference split temperature for a day using one of a function and a mapping that relates averages OATs to reference split temperatures. The reference module 476 determines the reference first temperature difference for a day using one of a function and a mapping that relates averages OATs to reference first temperature differences. The reference module 476 determines the reference second temperature difference for a day using one of a function and a mapping that relates averages OATs to reference second temperature differences.

An airflow module 480 determines the airflow score for a day based on the first temperature difference of the day, the second temperature difference of the day, the average split temperature of the day, a reference split temperature for the day, a reference first temperature difference for the day, and a reference second temperature difference for the day. The airflow module 480 may determine the airflow score using one or more functions or mappings that relate the above parameters to airflow scores. Additionally or alternatively, the airflow module 480 may determine the airflow score based on the above parameters using fuzzy logic. For example only, the airflow module 480 may determine the airflow score for a day based on or using the relationship:

$$\text{Airflow}=PD+TSW2*TS-TSRef)+TD1W2*(TD1+TD1\text{Offset}2-TD1Ref)+TD2W2*(TD2-TD2Ref),$$

where Airflow is the airflow score for the day, PD is the power difference for the day, TSW2 is a second predetermined weighting value for split temperatures, TS is the average split temperature for the day, and TSRef is the reference split temperature for the day. TD1W2 is a second predetermined weighting value for first temperature differences, TD1 is the average first temperature difference for the day, TD1Offset2 is a second predetermined offset value for first temperature differences, TD1 Ref is the reference first temperature difference for the day, TD2W2 is a second predetermined weighting value for second temperature differences, TD2 is the average second temperature difference for the day, and TD2Ref is the reference second temperature difference for the day. The airflow score may correspond to a decrease in the grade of the heat pump attributable to airflow restriction. In various implementations, a second predetermined offset value for split temperatures may also be added to or subtracted from the difference between the average split temperature and the reference split temperature. Additionally or alternatively, a second predetermined offset value for second temperature differences may be added to or subtracted from the difference between the average second temperature difference and the reference second temperature difference.

The second predetermined weighting value for split temperatures may be greater than the second predetermined weighting value for first temperature differences, and the second predetermined weighting value for first temperature differences may be greater than the second predetermined weighting value for second temperature differences. For example only, the second predetermined weighting value for split temperatures may be approximately 5, the second predetermined weighting value for first temperature differences may be 2.5, and the second predetermined weighting value for second temperature differences may be approximately 0.4. However, the second predetermined weighting values may be other suitable values. The second predetermined offset value for first temperature differences may be, for example, 5 or another suitable value.

The grade determination module 412 generates a grade for the heat pump for the day based on the power difference of the day, the capacity score for the day, and the airflow score for the day. For example, the grade determination module 412 may determine the grade of the heat pump by subtracting the power difference, the capacity score, and the airflow score from 100. The grade may therefore be a numerical value between 0 and 100, where 100 corresponds to a best grade for the heat pump and 0 corresponds to a worst grade for the heat pump. The reporting module 416 generates a displayable report for the heat pump, as described above.

Figure 7:
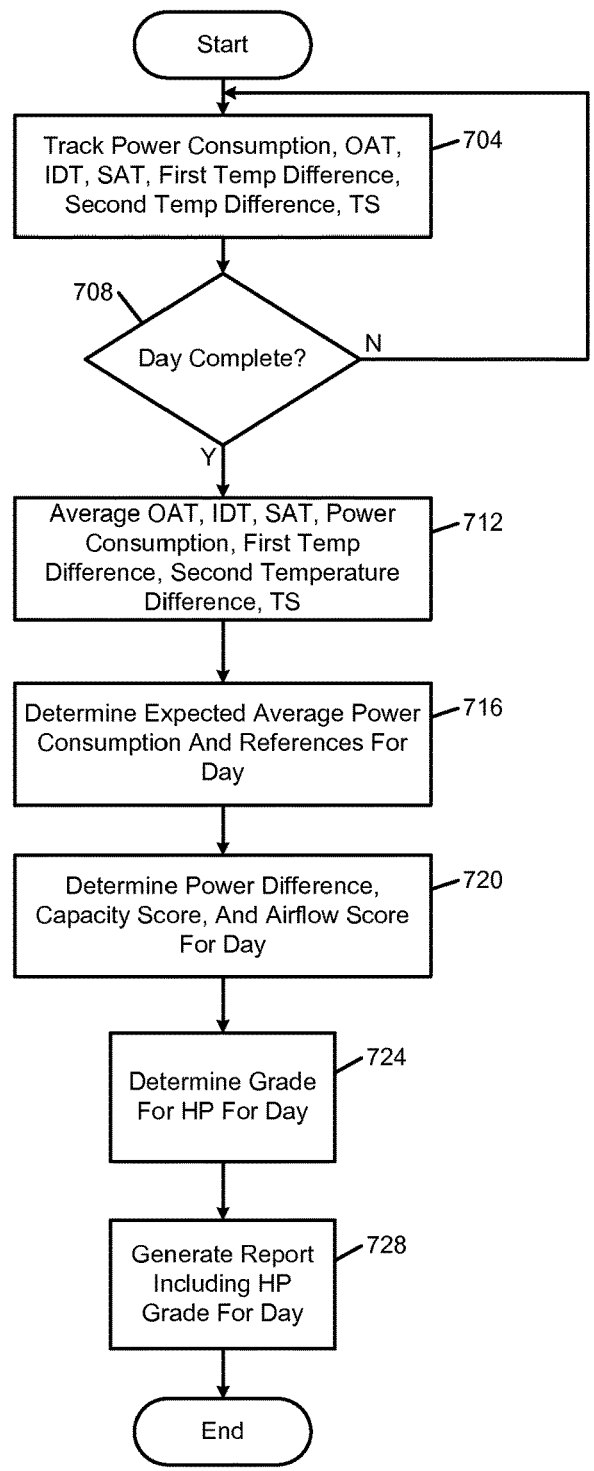
FIG. 7 is a flowchart depicting an example method of grading the heat pump of a building.

FIG. 7 includes a flowchart depicting an example method of grading the heat pump of the building for a day. Control may begin at 704 where control tracks the power consumption of the heat pump, the OAT, the supply air temperature (SAT), and the IDT. Control also tracks the first temperature difference, the second temperature difference, the split temperature.

At 708, control determines whether the day is complete. If 708 is true, control continues with 712. If 712 is false, control returns to 704 and continues tracking the power consumption, the OAT, the supply air temperature, the IDT, the SAT, the first and second temperature differences, and the split temperature.

Control averages the OATs of the day and averages the IDTs of the day at 712 to produce an average OAT for the day and an average IDT for the day. Control also averages the power consumption values to determine the average power consumption at 712. Also at 712, control averages the SATs to produce an average SAT for the day, the first temperature differences of the day to determine the average first temperature difference of the day, the second temperature differences of the day to determine the average second temperature difference of the day, and the split temperatures to determine the average split temperature of the day.

At 716, control determines the expected average power consumption of the heat pump for the day. Control determines the expected average power consumption of the heat pump for the day using a mapping that relates OAT and (optionally) IDT to expected average power consumption, as discussed above. Also at 716, control determines the reference values used to determine the capacity and airflow scores for the day. These reference values include the reference temperature split for the day, the reference first temperature difference for the day, and the reference second temperature difference for the day. Control determines the reference values based on the average OAT for the day, as discussed above.

At 720, control determines the power difference for the day between the average power consumption of the heat pump for the day and the expected average power consumption of the heat pump for the day. For example, control may set the power difference equal to the average power consumption minus the expected average power consumption.

Control also determines the capacity score for the day and the airflow score for the day at 720. Control determines the capacity score for the day based on the power difference for the day, the average split temperature of the day, the reference split temperature for the day, the average first temperature difference of the day, the reference first temperature difference of the day, the average second temperature difference of the day, and the reference second temperature difference of the day, as discussed above. Control determines the airflow score for the day based on the power difference for the day, the average split temperature of the day, the reference split temperature for the day, the average first temperature difference of the day, the reference first temperature difference of the day, the average second temperature difference of the day, and the reference second temperature difference of the day, as discussed above.

At 724, control generates the grade of the heat pump for the day based on the power difference of the day, the capacity score of the day, and the airflow score of the day. For example, control may set the grade based on or equal to 100 minus the power difference minus the capacity score minus the airflow score. Additionally or alternatively, control may determine the grade based on whether one or more other parameters associated with the heat pump are within respective ranges for the day. Examples of other parameters may include, for example, a run time of an auxiliary HVAC system of the day, a run time of the heat pump of the day, and a power factor of the heat pump of the day.

Control generates a report including the grade of the heat pump for the day at 728. Control may generate the report to include other information, such as one or more changes in grades of the heat pump over a period of days, one or more trends in the grades of the heat pump over a period of days, and/or one or more grades of heat pumps of other local buildings. The report can be displayed on a display, such as a display of the customer device 324 and/or a display of the contractor device 320.

Figure 8:
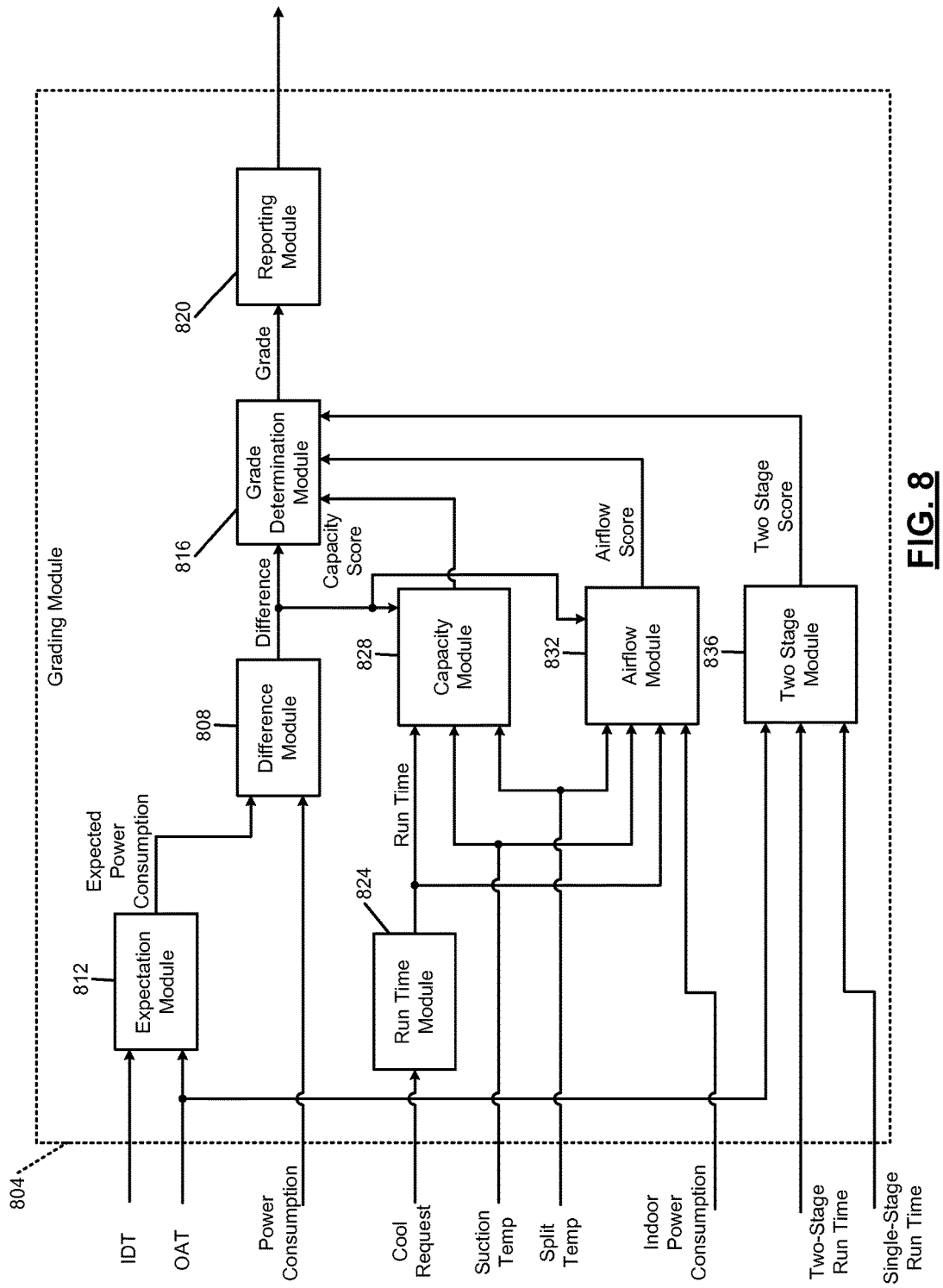
FIG. 8 is a functional block diagram of an example grading module that grades the A/C system of a building.

FIG. 8 includes a functional block diagram of a grading module 804. The grading module 804 may be implemented, for example, in the monitoring server 308. The grading module 804 grades an A/C system of a building.

The grading module 804 grades the A/C system based on a difference between a power consumption of the A/C system and an expected power consumption of the A/C system over a predetermined period, such as a day. The grading module 804 generates a report for the A/C system including the grade of the A/C system. The report may help an owner/operator of the building visualize trends, changes, and a time history of grades of the A/C system. The report may also include other information, such as grades of A/C systems of other buildings within a predetermined distance and/or other suitable information.

A difference module 808 determines a power difference between an average power consumption of the A/C system during a day and an expected average power consumption of the A/C system for that day. The difference module 808 determines a power difference each day. While the example time period of a day will be discussed, the A/C system may be graded based on average power consumption and expected average power consumption of the A/C system over another suitable predetermined time period.

The difference module 808 may set the power difference for a day, for example, equal to the average power consumption of the day minus the expected average power consumption for the day. The average power consumption of the A/C system may be an average of the measured power consumption of electrical components of the A/C system during the day. The expected average power consumption may be an expected average power consumption of the A/C system for the day.

The difference module 808 may monitor one or more parameters measured by sensors associated with the A/C system and determine the average power consumption of the A/C system during a day based on the measured parameters. For example, the difference module 808 may determine the average power consumption of the A/C system based on current flow to the condenser unit of the A/C system, voltage input to the condenser unit of the A/C system, current flow to the air handler unit of the A/C system, and voltage input to the air handler unit of the A/C system. Additionally or alternatively, the air handler monitor module 200 or the condensing monitor module 204 of the A/C system may provide the power consumption measurements to the grading module 804, and the grading module 804 may average the measurements each day.

An expectation module 812 determines the expected average power consumption of the A/C system for each day. The expectation module 812 determines the expected average power consumption of the A/C system for a day based on one or more outdoor ambient temperatures (OATs) of the building of the A/C system during the day. The expectation module 812 may determine the expected average power consumption of the A/C system for a day further based on one or more indoor temperatures (IDTs) of the building of the A/C system for the day. The indoor temperature may be, for example, the setpoint temperature of a thermostat of the building or the RAT of the building. The OAT and the RAT may be measured using temperature sensors, as described above.

The OAT and the IDT may be sampled every predetermined period by the air handler monitor module 200 and/or the condensing monitor module 204. The expectation module 812 may determine the expected average power consumption for the day, for example, based on an average of the OATs of the day and an average of the IDTs of the day. The expectation module 812 determines the expected average power consumption using a stored mapping that relates OAT and IDT to expected average power consumption of the A/C system.

The mapping may be populated based on data provided by a manufacturer of the A/C system. More specifically, the mapping may be populated based on a SEER rating of the A/C system and a tonnage rating of the A/C system. The expected average power consumption of the A/C system can then be determined using OAT and (optionally) IDT. Alternatively, the expected average power consumption of the A/C system may be determined using a mapping that relates SEER ratings, tonnage ratings, and average OATs to expected average power consumption. This mapping may also involve average IDTs.

A grade determination module 816 generates a grade for the A/C system for the day based on the power difference of the day. The grade determination module 816 generates the grade for the A/C system for the day further based on a capacity score for the A/C system for the day, an airflow score for the A/C system for the day. When the A/C system includes a two-stage system, the grade determination module 816 generates the grade for the A/C system further based on a two stage score for the A/C system for the day.

For example, the grade determination module 816 may determine the grade of the A/C system by subtracting the power difference, the capacity score, the airflow score, and the two stage score from 100. The grade may therefore be a numerical value between 0 and 100, where 100 corresponds to a best grade for the A/C system and 0 corresponds to a worst grade for the A/C system.

The numerical value can be converted into, for example, a letter grade, such as A, B, C, D, or E. Predetermined ranges of numeric values can be defined for each possible letter grade. The grade determination module 816 may determine a letter grade for the A/C system for the day according to the predetermined range within which the numeric value falls.

A reporting module 820 generates a displayable report for the A/C system including the grade of the A/C system for the day. The reporting module 820 may also generate the report to include other information, such as one or more grades of the A/C system for one or more previous days to provide a time history of the grades of the A/C system over multiple days. The report may additionally or alternatively include other information, such as a change in the grades over a predetermined period, trends in the grades of the A/C system, and/or grades determined for other A/C system of buildings located near the building on the same day(s). The reporting module 820 may generate the report daily, monthly, weekly, seasonally, every predetermined number of days or at another suitable frequency. The report may be displayed on a display, such as the contractor device 320 and/or the customer device 324.

A run time module 824 tracks how long the A/C system is ON to cool the building during each day. This period may be referred to as a run time of the A/C system. The run time module 824 tracks the run time of the A/C system each day. The run time module 824 may increment the run time, for example, when a request for operation of the A/C system is being generated, such as a cool request from a thermostat of the building.

The run time module 824 may track a single-stage run time for each day, a two-stage run time of the A/C system for each day, and a total run time for each day. The single-stage run time of a day may correspond to a period of operation of only the single-stage of the A/C system during the day. In other words, the single-stage run time may correspond to a period of operation of the A/C system in single-stage mode during the day. The two-stage run time of a day may correspond to a period of operation of both (two) stages of the A/C system during the day. In other words, the two-stage run time may correspond to a period of operation of the A/C system in two-stage mode during the day. The sum of the single and two-stage run times of a day is equal to the total run time of the A/C system for the day.

A capacity module 828 determines the capacity score for the A/C system and the day based on the total run time of the A/C system during the day, an average suction temperature during the day, the average split temperature during the day, and the power difference of the day. The capacity module 828 may determine the capacity score using one or more functions or mappings that relate the above parameters to capacity scores. Additionally or alternatively, the capacity module 828 may determine the capacity score based on the above parameters using fuzzy logic.

For example only, the capacity module 828 may determine the capacity score for a day based on or using the relationship:

$$Capacity = RTC + STC + TSC + PDC,$$

where Capacity is the capacity score for the day, RTC is a run time component (value) of the capacity score, STC is a suction temperature component (value) of the capacity score, TSC is a split temperature component (value) of the capacity score, and PDC is a power difference component (value) of the capacity score. The capacity module 828 may determine the run time component of the capacity score using one of a function and a mapping that relates total run times of a day to run time component values. The capacity module 828 may determine the suction temperature component of the capacity score using one of a function and a mapping that relates average suction temperatures of a day to suction temperature component values. The capacity module 828 may determine the split temperature component of the capacity score using one of a function and a mapping that relates average split temperatures of a day to split temperature component values. The capacity module 828 may determine the power difference component of the capacity score using one of a function and a mapping that relates power differences of a day to power difference component values. The capacity score may correspond to a decrease in the grade of the A/C system attributable to the capacity of the A/C system being low.

Figure 10A:
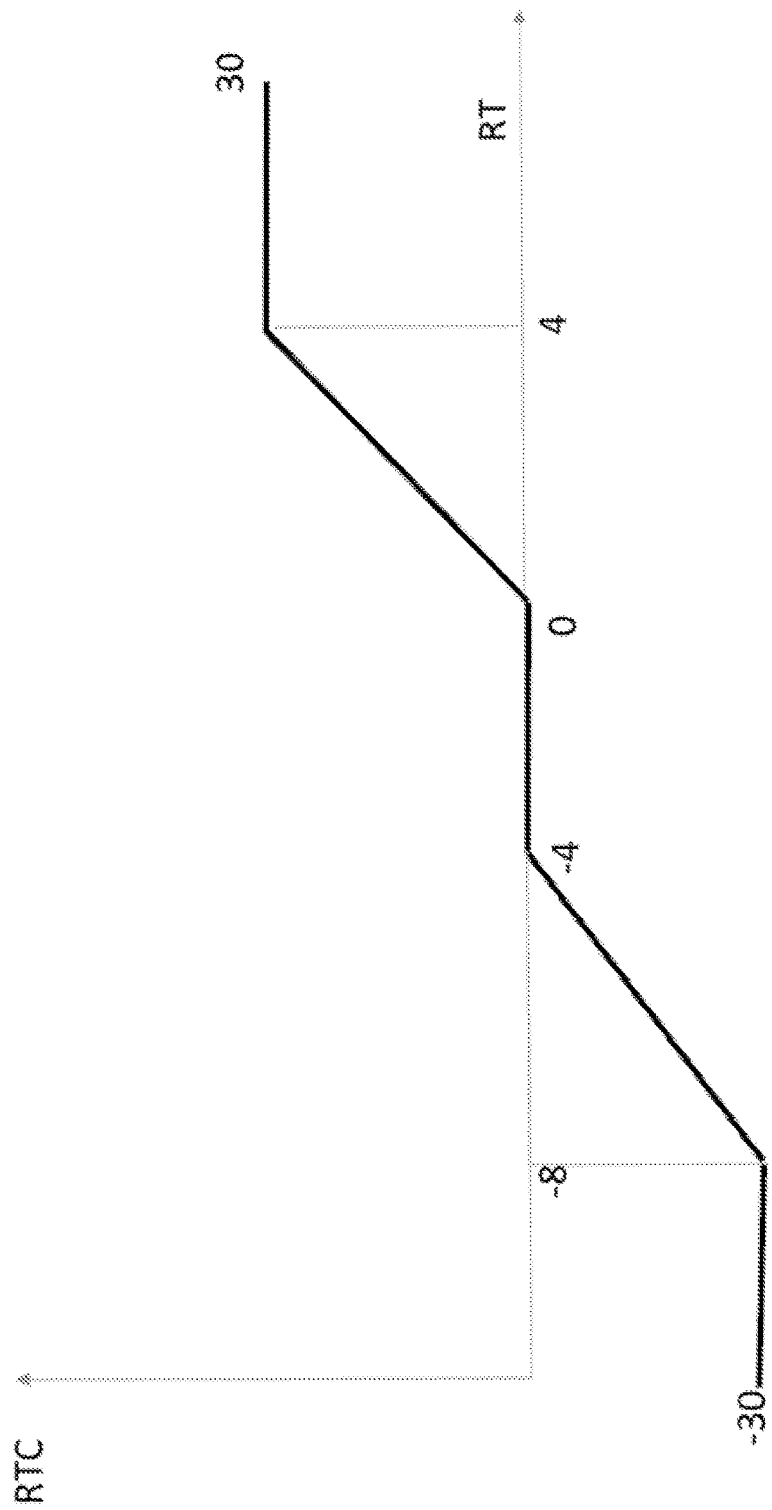
FIGS. 10A-10D include example graphs of components of a capacity score of an A/C system score versus respective input parameters.

FIG. 10A includes an example graph of the run time component (RTC) of the capacity score versus runtime (RT). In various implementations, runtime may be expressed in terms of run time greater than an expected runtime, where zero corresponds to when the runtime is equal to the expected runtime of a day.

Figure 10B:
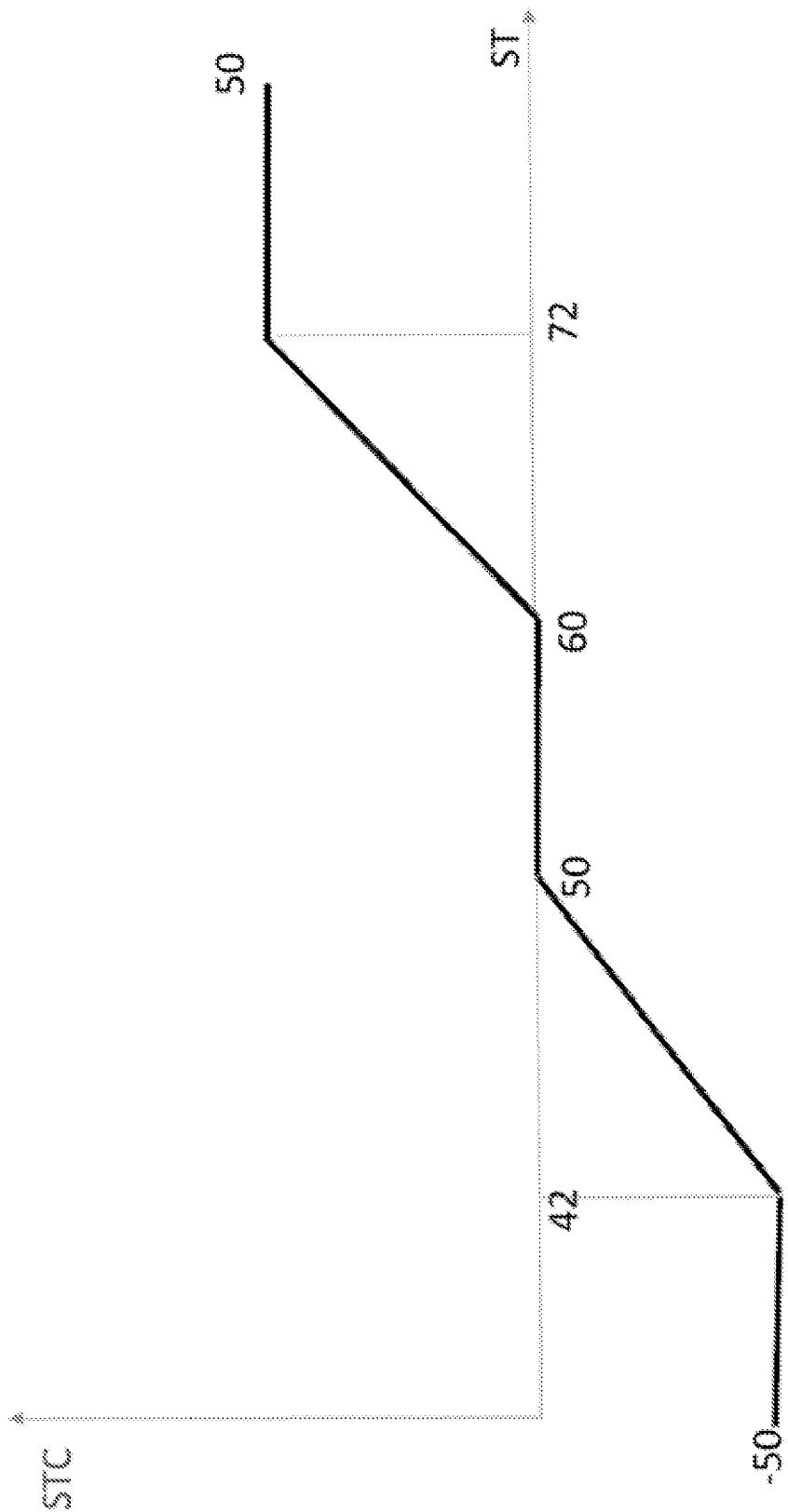
Figure 10C:
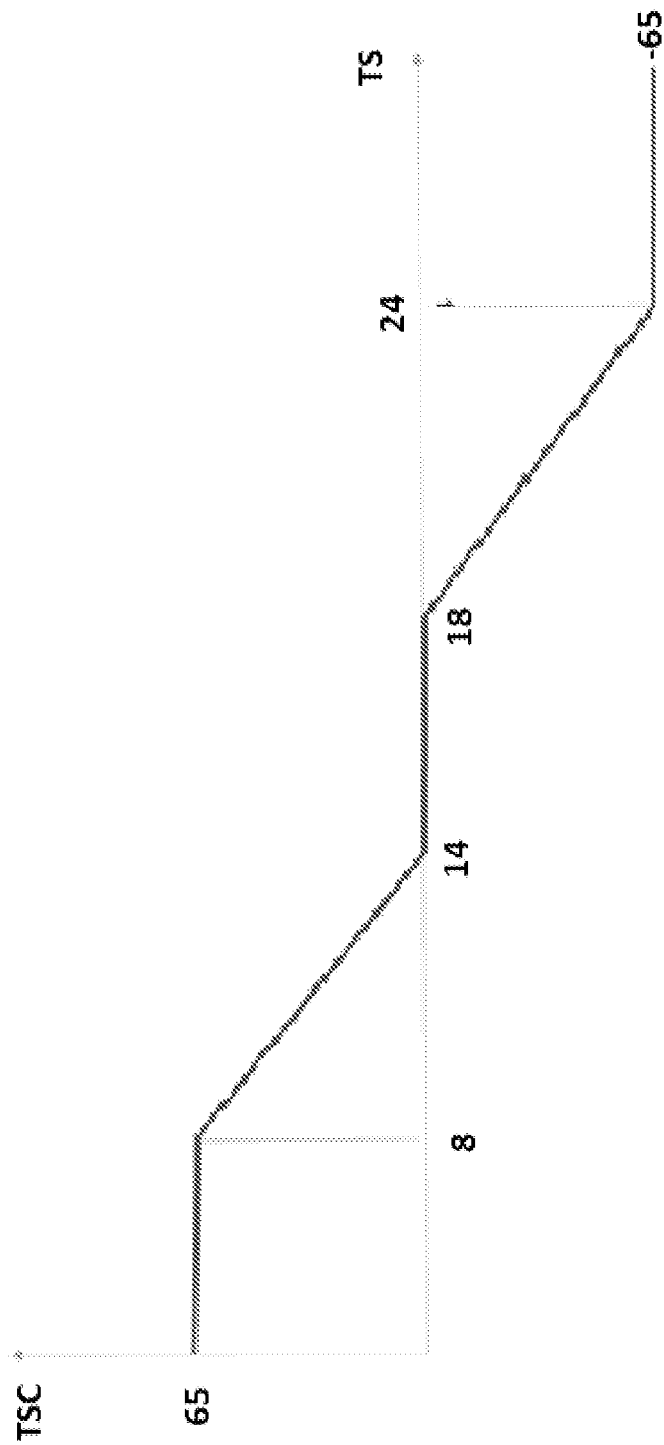
Figure 10D:
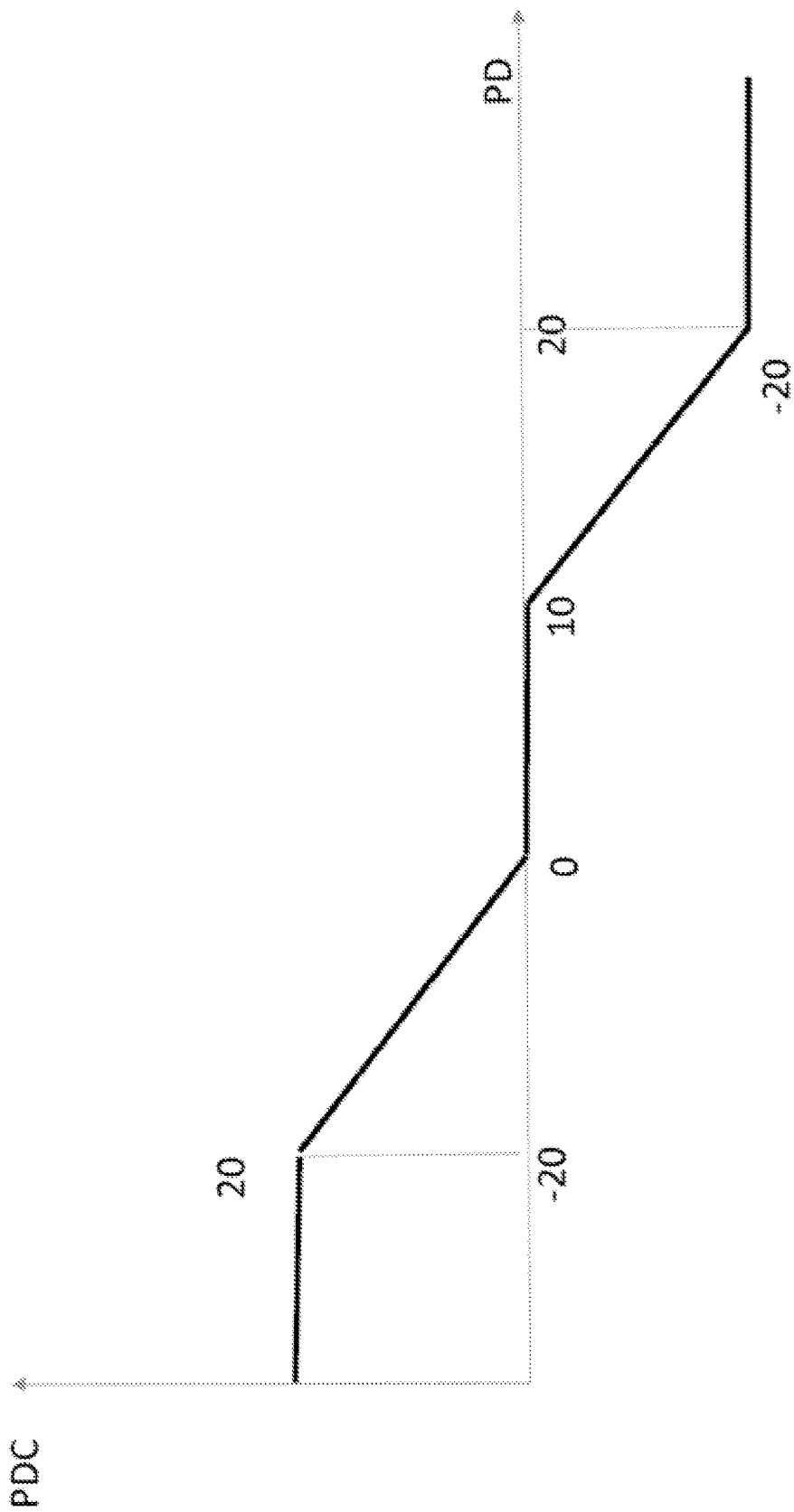

FIG. 10B includes an example graph of the suction temperature component (TSC) of the capacity score versus suction temperature (ST). FIG. 10C includes an example graph of the temperature split component (TSC) of the capacity score versus split temperature (TS). FIG. 10D includes an example graph of the power difference component (PDC) of the capacity score versus power difference (PD).

An airflow module 832 determines the airflow score for the A/C system and the day based on the total run time of the A/C system during the day, an average suction temperature during the day, the average split temperature during the day, and an indoor power consumption of the A/C system during the day. The indoor power consumption may refer to a power consumption of the indoor unit of the A/C system (e.g., the air handler unit 136). The airflow module 832 may determine the airflow score using one or more functions or mappings that relate the above parameters to airflow scores. Additionally or alternatively, the airflow module 832 may determine the airflow score based on the above parameters using fuzzy logic.

For example only, the airflow module 832 may determine the airflow score for a day based on or using the relationship:

Airflow=$RTC+STC+TSC+IDPC$, where Airflow is the airflow score for the day, RTC is a run time component (value) of the airflow score, STC is a suction temperature component (value) of the airflow score, TSC is a split temperature component (value) of the airflow score, and IDPC is an indoor power consumption component (value) of the airflow score. The airflow module 832 may determine the run time component of the airflow score using one of a function and a mapping that relates total run times of a day to run time component values. The airflow module 832 may determine the suction temperature component of the airflow score using one of a function and a mapping that relates average suction temperatures of a day to suction temperature component values. The airflow module 832 may determine the split temperature component of the airflow score using one of a function and a mapping that relates average split temperatures of a day to split temperature component values. The airflow module 832 may determine the indoor power consumption component of the airflow score using one of a function and a mapping that relates indoor power consumptions of a day to indoor power consumption component values. The airflow score may correspond to a decrease in the grade of the A/C system attributable to low airflow of the A/C system.

Figure 11A:
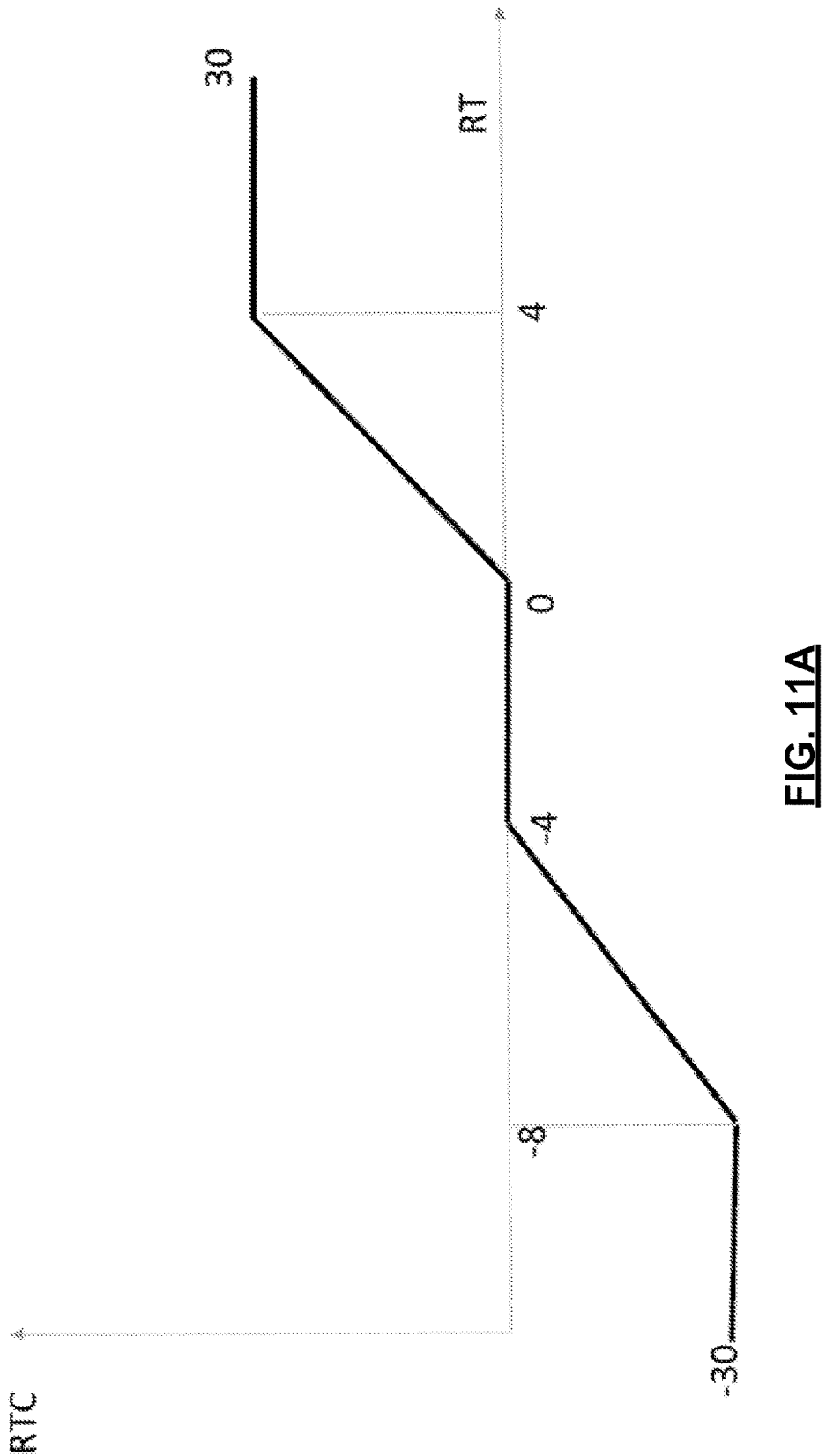
FIGS. 11A-11D include example graphs of components of an airflow score of an A/C system versus respective input parameters.

FIG. 11A includes an example graph of the run time component (RTC) of the airflow score versus runtime (RT). In various implementations, runtime may be expressed in terms of run time greater than an expected runtime, where zero corresponds to when the runtime is equal to the expected runtime of a day.

Figure 11B:
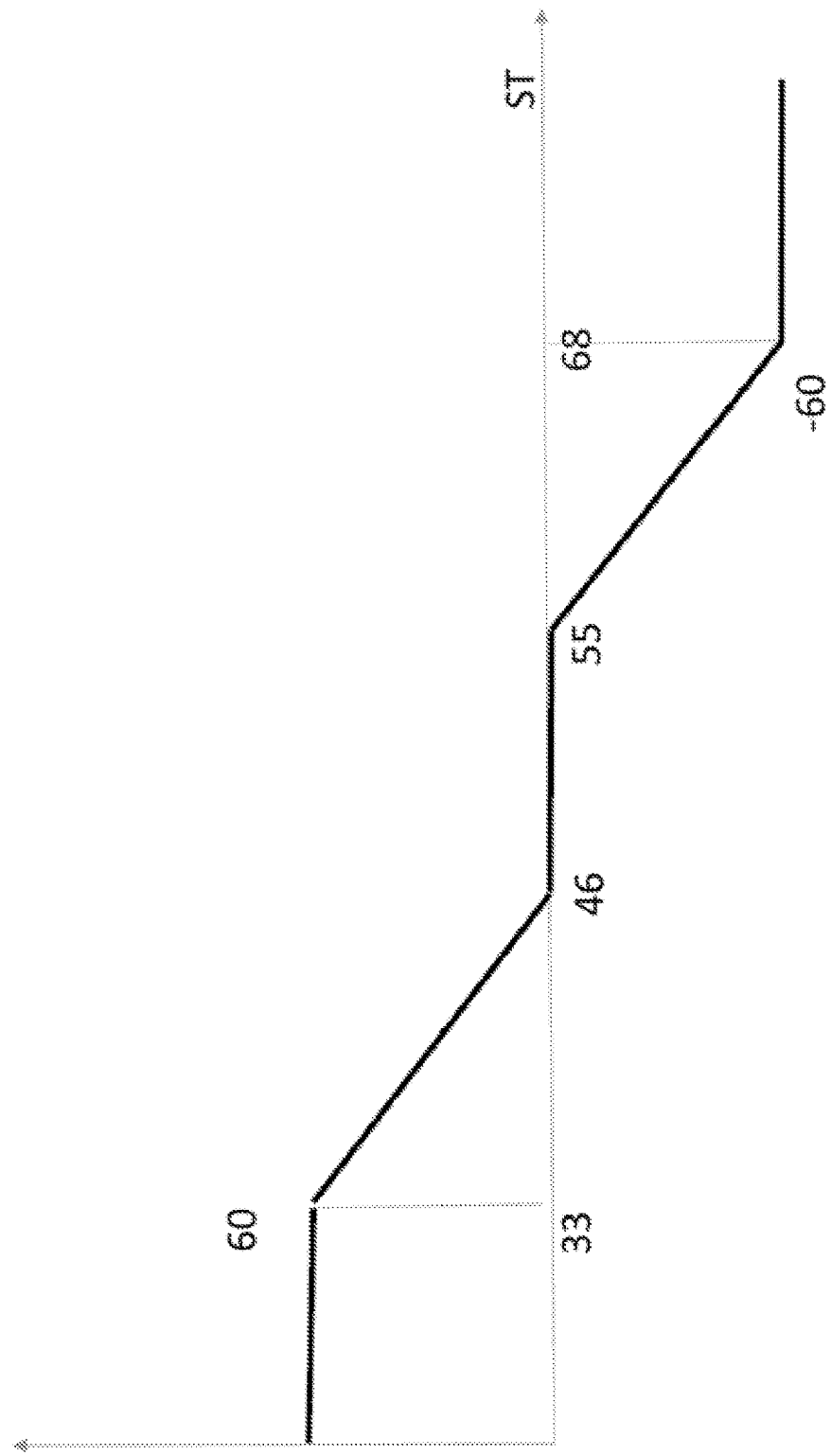
Figure 11C:
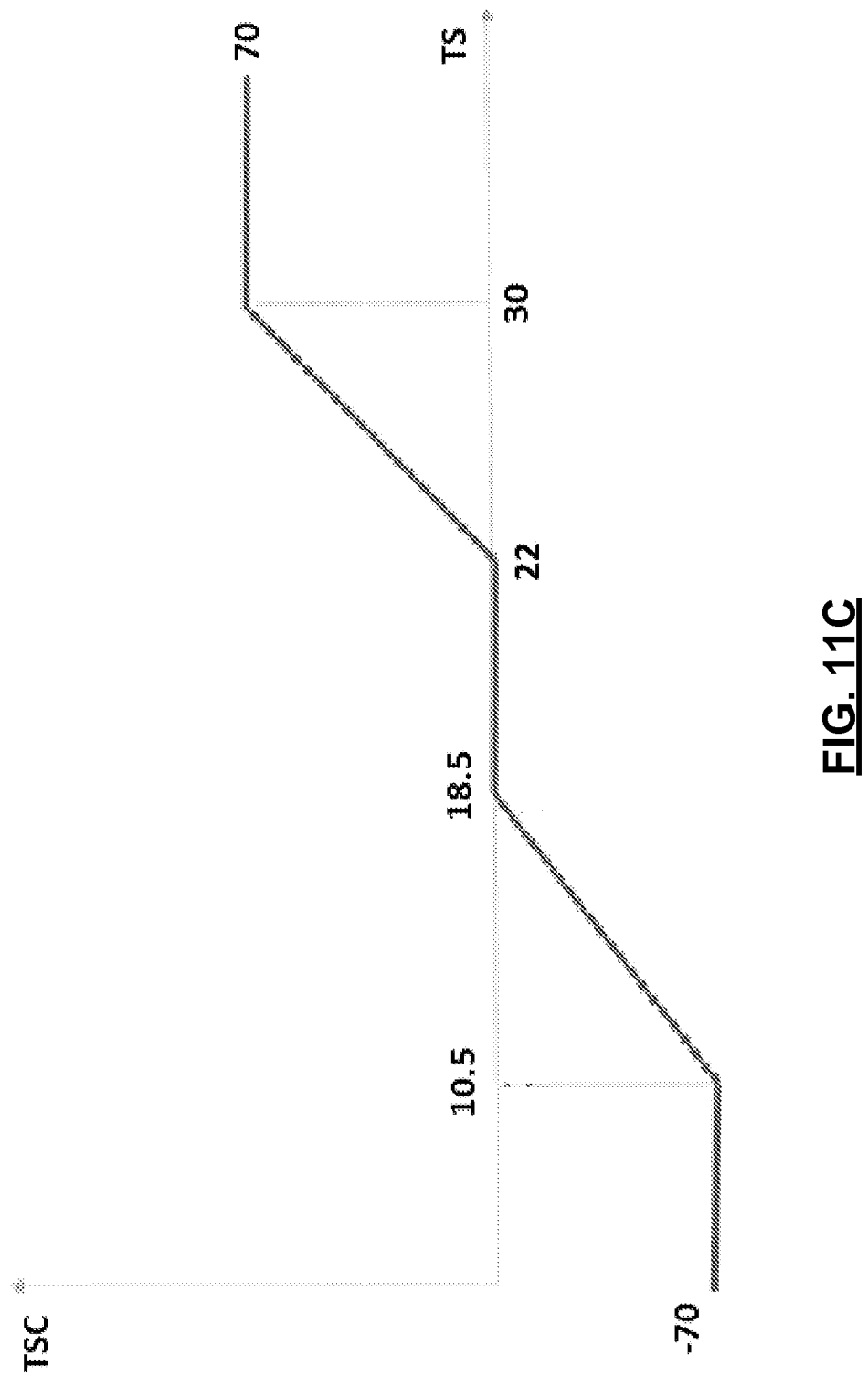
Figure 11D:
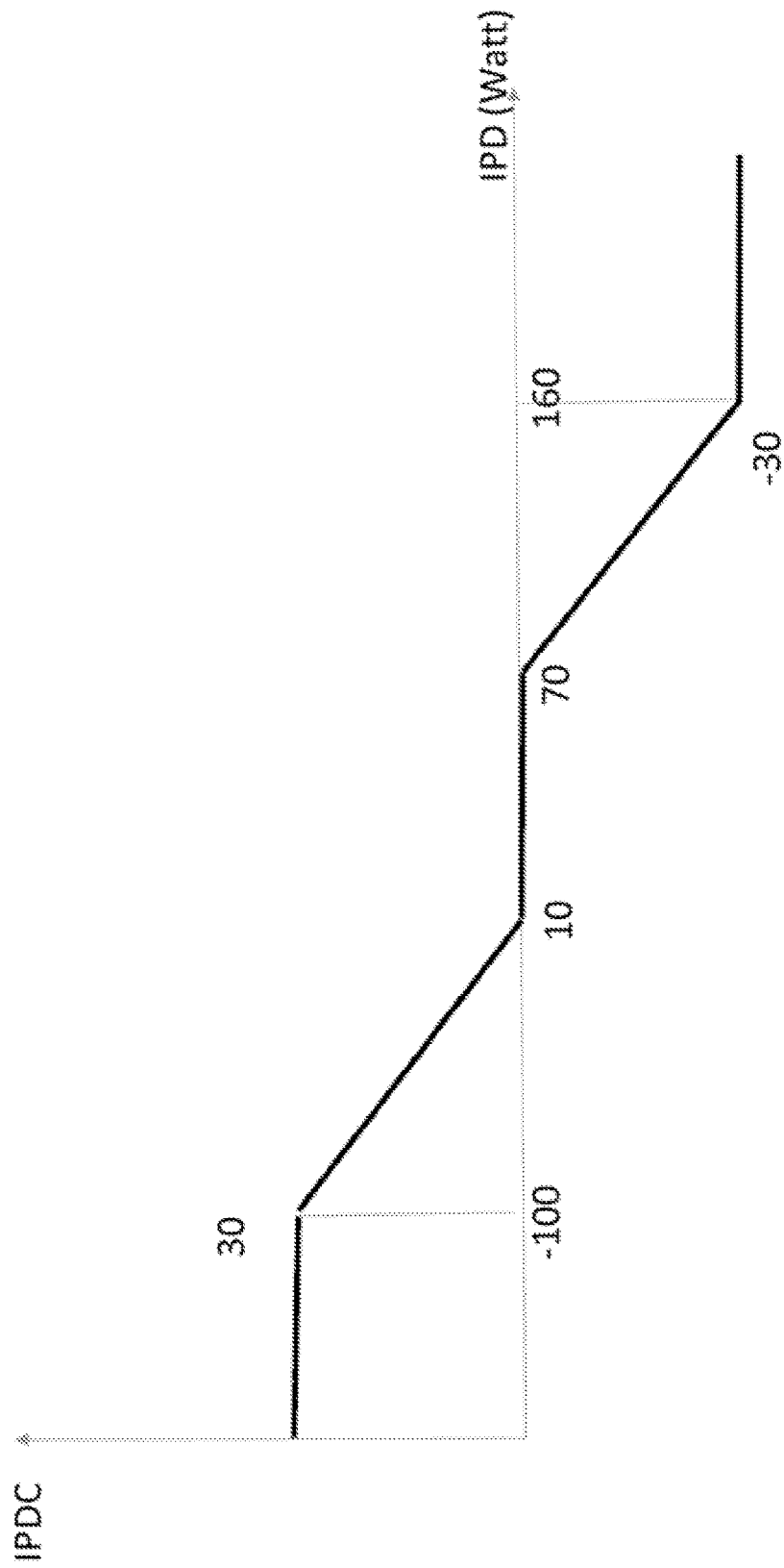

FIG. 11B includes an example graph of the suction temperature component (TSC) of the airflow score versus suction temperature (ST). FIG. 11C includes an example graph of the temperature split component (TSC) of the airflow score versus split temperature (TS). FIG. 11D includes an example graph of the indoor power consumption component (IDPC) of the airflow score versus indoor power difference (IPD). The indoor power difference may be determined based on a difference between an indoor power consumption of the A/C system and an expected indoor power consumption of the A/C system.

The airflow module 832 may determine the average indoor power consumption of the A/C system for a day based on, for example, current flow to the air handler unit of the A/C system and voltage input to the air handler unit of the A/C system. Additionally or alternatively, the air handler monitor module 200 may provide indoor power consumption measurements to the grading module 804, and the grading module 804 may average the measurements each day to determine the average indoor power consumption. Expected indoor power consumption may be determined similar to how the expected power consumption determined by the expectation module 812.

A two stage module 836 determines the two stage score for the A/C system for a day based on the OAT, the single-stage run time of the A/C system of the day, and the two-stage run time of the A/C system of the day. The two stage module 836 may determine the two stage score for a day, for example, using one or more functions or mappings that relate the average OATs, single-stage run times, and two-stage run times to two stage scores. The two stage score may correspond to a decrease in the grade of the A/C system attributable to operation of the A/C system in the two stage mode for longer than expected or when not expected, which is less efficient than operation in the single stage mode.

As stated above, the grade determination module 816 determines the grade for the A/C system during a day based on the power difference of the A/C system of the day, the capacity score of the A/C system of the day, the airflow score of the A/C system of the day, and the two-stage score of the A/C system of the day.

Figure 9:
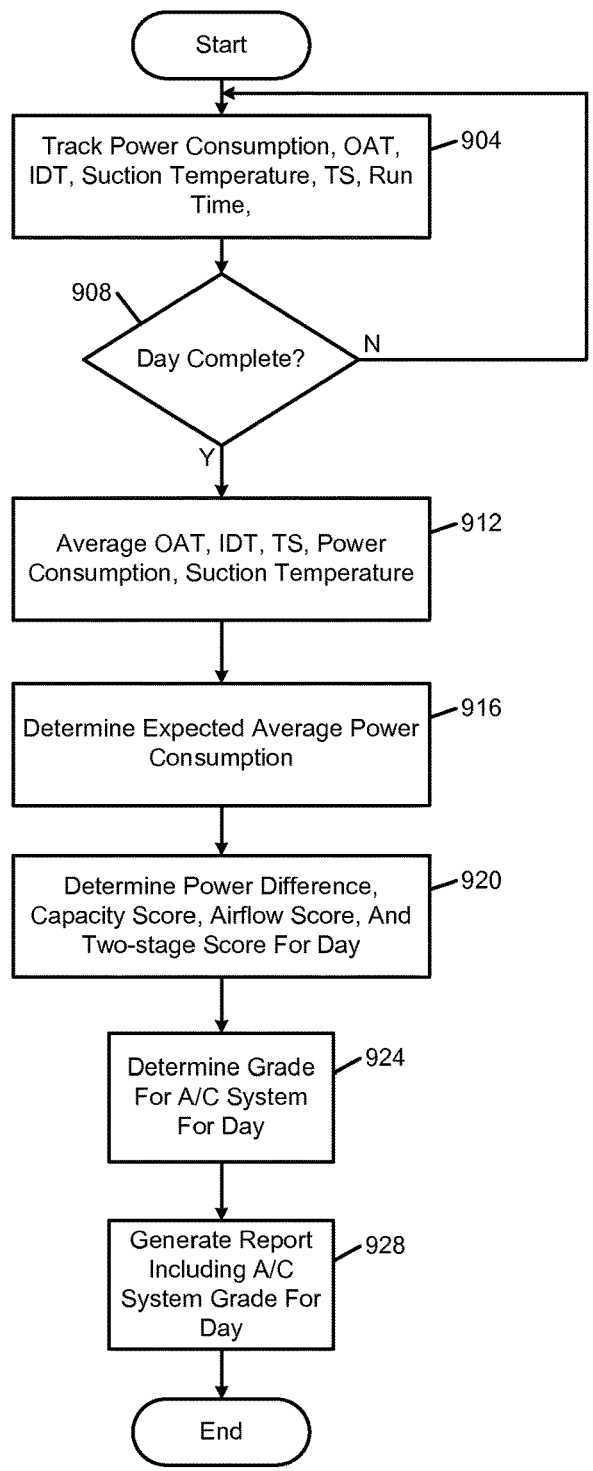
FIG. 9 includes a flowchart depicting an example method of grading the A/C system of a building.

FIG. 9 includes a flowchart depicting an example method of grading the A/C system of the building for a day. Control may begin at 904 where control tracks the power consumption of the A/C system, the OAT, the IDT, the suction temperature, the split temperature, and the run time of the A/C system. The power consumption includes both the total (indoor plus outdoor) power consumption and the indoor power consumption of the A/C system. The run time includes single-stage run time, two-stage run time, and total run time of the A/C system.

At 908, control determines whether the day is complete. If 908 is true, control continues with 912. If 908 is false, control returns to 904 and continues tracking the power consumption, the OAT, the IDT, the suction temperature, the split temperature, and the run time of the A/C system.

Control averages the OATs of the day and averages the IDTs of the day at 912 to produce an average OAT for the day and an average IDT for the day. Control also averages the power consumption values to determine the average power consumption at 912. This includes an average total power consumption of the day and an average indoor power consumption of the day. Also at 912, control averages the split temperatures to produce an average split temperature for the day and averages the suction temperatures to produce an average suction temperature for the day.

At 916, control determines the expected average power consumption of the A/C system for the day. Control determines the expected average power consumption of the A/C system for the day using based on the OAT, (optionally) the IDT, the SEER rating of the A/C system, and the tonnage rating of the A/C system, as discussed above.

At 920, control determines the power difference for the day between the average power consumption of the A/C system for the day and the expected average power consumption of the A/C system for the day. For example, control may set the power difference equal to the average power consumption minus the expected average power consumption.

Control also determines the capacity score for the day and the airflow score for the day at 920. Control determines the capacity score for the day based on the power difference for the day, the average suction temperature of the day, the total run time of the day, and the average split temperature of the day, as discussed above. Control determines the airflow score for the day based on the average indoor power consumption for the day, the average split temperature of the day, average suction temperature of the day, and the total runtime of the day, as discussed above. Control may also determine the two stage score for the day at 920. Control determines the two stage score for the day based on the single-stage run time of the day, the two stage run time of the day, and the average OAT of the day. If the A/C system is a single-stage A/C system, control may set the two stage score to a predetermined value that has no effect on the grade (e.g., zero).

At 924, control generates the grade of the A/C system for the day based on the power difference of the day, the capacity score of the day, the airflow score of the day, and the two stage score of the day. For example, control may set the grade based on or equal to 100 minus the power difference minus the capacity score minus the airflow score minus the two stage score.

Control generates a report including the grade of the A/C system for the day at 928. Control may generate the report to include other information, such as one or more changes in grades of the A/C system over a period of days, one or more trends in the grades of the A/C system over a period of days, and/or one or more grades of A/C system of other local buildings. The report can be displayed on a display, such as a display of the customer device 324 and/or a display of the contractor device 320.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A grading system, comprising:
   one or more processors;
   memory including instructions that, when executed by the one or more processors, cause the one or more processors to:
   receive, from sensors of a building over a network, indoor temperatures of the building during a predetermined period, outdoor temperatures at the building during the predetermined period, and power consumptions of a heat pump of the building during the predetermined period,
   determine an expected average power consumption of the heat pump of the building for the predetermined period as a function of the indoor and outdoor temperatures of the building during the predetermined period;
   determine a power difference between an average power consumption of the heat pump during the predetermined period and the expected average power consumption of the heat pump for the predetermined period;
   determine an initial grade of the heat pump for the predetermined period based on the power difference of the predetermined period;
   determine a final grade of the heat pump for the predetermined period based on a comparison of a temperature range for the predetermined period with an average of temperature differences between return air temperatures of the predetermined period and supply air temperatures of the predetermined period, respectively, the determination of the final grade including:
   when the average of the temperature differences is less than a lower limit of the temperature range, setting the final grade based on:

Initial Grade−$Gain_{Low}$*(Lower Limit−TS), where Initial Grade is the initial grade, $Gain_{Low}$ is a predetermined lower gain value, Lower Limit is the lower limit of the temperature range, and TS is the average of the temperature differences; and
   when the average of the temperature differences is greater than an upper temperature limit of the temperature range, setting the final grade based on:

Initial Grade−$Gain_{High}$*(Upper Limit−TS), where Initial Grade is the initial grade, $Gain_{High}$ is a predetermined upper gain value that is greater than the predetermined lower gain value, Upper Limit is the upper limit of the temperature range, and TS is the average of the temperature differences;
   generate a displayable report including the final grade of the heat pump for the predetermined period;
   transmit the displayable report to a user computing device associated with the building; and
   control the heat pump of the building.

2. The grading system of claim 1 wherein the instructions include instructions that, when executed by the one or more processors, cause the one or more processors to determine the expected average power consumption of the heat pump for the predetermined period using a mapping that relates indoor and outdoor temperatures to expected average power consumption of the heat pump.

3. The grading system of claim 1 wherein the instructions include instructions that, when executed by the one or more processors, cause the one or more processors to determine the expected average power consumption of the heat pump for the predetermined period as a function of: (i) an average of a plurality of indoor air temperatures measured during the predetermined period; and (ii) an average of a plurality of outdoor air temperatures measured during the predetermined period.

4. The grading system of claim 1 wherein the instructions include instructions that, when executed by the one or more processors, cause the one or more processors to set the initial grade of the heat pump for the predetermined period based on 100 minus an absolute value of the power difference of the predetermined period.

5. The grading system of claim 1 wherein the instructions further include instructions that, when executed by the one or more processors, cause the one or more processors to determine an adjusted power difference for the predetermined period based on the power difference of the predetermined period,
wherein the instructions include instructions that, when executed by the one or more processors, cause the one or more processors to determine the initial grade of the heat pump for the predetermined period based on the adjusted power difference of the predetermined period.

6. The grading system of claim 5 wherein the instructions include instructions that, when executed by the one or more processors, cause the one or more processors to:
when the average power consumption of the heat pump during the predetermined period is greater than the expected average power consumption of the heat pump for the predetermined period, determine the adjusted power difference based on a product of a first predetermined gain and the power difference of the predetermined period; and,
when the average power consumption of the heat pump during the predetermined period is less than the expected average power consumption of the heat pump for the predetermined period, determine the adjusted power difference based on a product of a second predetermined gain and the power difference of the predetermined period.

7. The grading system of claim 6 wherein the first predetermined gain is one of greater than and less than the second predetermined gain.

8. The grading system of claim 1 wherein the instructions further include instructions that, when executed by the one or more processors, cause the one or more processors to set the temperature range for the predetermined period based on the outdoor temperature of the building during the predetermined period.

9. The grading system of claim 1 wherein the instructions further include instructions that, when executed by the one or more processors, cause the one or more processors to increase the predetermined upper gain value when the average power consumption of the heat pump during the predetermined period is greater than the expected average power consumption of the heat pump for the predetermined period.

10. The grading system of claim 1 wherein the instructions further include instructions that, when executed by the one or more processors, cause the one or more processors to double the predetermined upper gain value when the average power consumption of the heat pump during the predetermined period is greater than the expected average power consumption of the heat pump for the predetermined period.

11. The grading system of claim 1 wherein the instructions further include instructions that, when executed by the one or more processors, cause the one or more processors to increase the predetermined lower gain value when the average power consumption of the heat pump during the predetermined period is less than the expected average power consumption of the heat pump for the predetermined period.

12. The grading system of claim 1 wherein the instructions further include instructions that, when executed by the one or more processors, cause the one or more processors to double the predetermined lower gain value when the average power consumption of the heat pump during the predetermined period is less than the expected average power consumption of the heat pump for the predetermined period.

13. A grading method, comprising:
by one or more processors, receiving, from sensors of a building over a network, indoor temperatures of the building during a predetermined period, outdoor temperatures at the building during the predetermined period, and power consumptions of a heat pump of the building during the predetermined period;
by the one or more processors, determining an expected average power consumption of the heat pump of the building for the predetermined period as a function of the indoor and outdoor temperatures of the building during the predetermined period;
by the one or more processors, determining a power difference between an average power consumption of the heat pump during the predetermined period and the expected average power consumption of the heat pump for the predetermined period;
by the one or more processors, determining an initial grade of the heat pump for the predetermined period based on the power difference of the predetermined period; by the one or more processors, determining a final grade of the heat pump for the predetermined period based on a comparison of a temperature range for the predetermined period with an average of temperature differences between return air temperatures of the predetermined period and supply air temperatures of the predetermined period, respectively, the determining the final grade including:
when the average of the temperature differences is less than a lower limit of the temperature range, setting the final grade based on:

Initial Grade−$\text{Gain}_{Low}$*(Lower Limit−TS), where Initial Grade is the initial grade, $\text{Gain}_{Low}$ is a predetermined lower gain value, Lower Limit is the lower limit of the temperature range, and TS is the average of the temperature differences; and
when the average of the temperature differences is greater than an upper temperature limit of the temperature range, setting the final grade based on:

Initial Grade−$\text{Gain}_{High}$*(Upper Limit−TS), where Initial Grade is the initial grade, $\text{Gain}_{High}$ is a predetermined upper gain value that is greater than the predetermined lower gain value, Upper Limit is the upper limit of the temperature range, and TS is the average of the temperature differences;
by the one or more processors, generating a report including the final grade of the heat pump for the predetermined period;

by the one or more processors, transmitting the report to a user computing device associated with the building; and by the one or more processors, controlling the heat pump of the building.

14. The grading method of claim 13 wherein determining the expected average power consumption includes determining the expected average power consumption of the heat pump for the predetermined period using a mapping that relates indoor and outdoor temperatures to expected average power consumption of the heat pump.

15. The grading method of claim 13 wherein determining the expected average power consumption includes determining the expected average power consumption of the heat pump for the predetermined period as a function of: (i) an average of a plurality of indoor air temperatures measured during the predetermined period; and (ii) an average of a plurality of outdoor air temperatures measured during the predetermined period.

16. The grading method of claim 13 wherein determining the initial grade includes setting the initial grade of the heat pump for the predetermined period based on 100 minus an absolute value of the power difference of the predetermined period.

17. The grading method of claim 13 further comprising:
determining an adjusted power difference for the predetermined period based on the power difference of the predetermined period,
wherein determining the initial grade includes determining the initial grade of the heat pump for the predetermined period based on the adjusted power difference of the predetermined period.

18. The grading method of claim 17 wherein determining the initial grade includes:
when the average power consumption of the heat pump during the predetermined period is greater than the expected average power consumption of the heat pump for the predetermined period, determining the adjusted power difference based on a product of a first predetermined gain and the power difference of the predetermined period; and, when the average power consumption of the heat pump during the predetermined period is less than the expected average power consumption of the heat pump for the predetermined period, determining the adjusted power difference based on a product of a second predetermined gain and the power difference of the predetermined period.

19. The grading method of claim 18 wherein the first predetermined gain is one of greater than and less than the second predetermined gain.

20. The grading method of claim 13 further comprising setting the temperature range for the predetermined period based on the outdoor temperature of the building during the predetermined period.

21. The grading method of claim 13 further comprising increasing the predetermined upper gain value when the average power consumption of the heat pump during the predetermined period is greater than the expected average power consumption of the heat pump for the predetermined period.

22. The grading method of claim 13 further comprising doubling the predetermined upper gain value when the average power consumption of the heat pump during the predetermined period is greater than the expected average power consumption of the heat pump for the predetermined period.

23. The grading method of claim 13 further comprising increasing the predetermined lower gain value when the average power consumption of the heat pump during the predetermined period is less than the expected average power consumption of the heat pump for the predetermined period.

24. The grading method of claim 13 further comprising doubling the predetermined lower gain value when the average power consumption of the heat pump during the predetermined period is less than the expected average power consumption of the heat pump for the predetermined period.

* * * * *